US008618975B2

(12) United States Patent
Nys et al.

(10) Patent No.: US 8,618,975 B2
(45) Date of Patent: Dec. 31, 2013

(54) MULTI-BIT SUCCESSIVE APPROXIMATION ADC

(75) Inventors: Olivier Nys, Neuchatel (CH); Ark-Chew Wong, Irvine, CA (US)

(73) Assignee: Semtech Corporation, Camarillo, CA (US)

( * ) Notice: Subject to any disclaimer, the term of this patent is extended or adjusted under 35 U.S.C. 154(b) by 48 days.

(21) Appl. No.: 13/282,304

(22) Filed: Oct. 26, 2011

(65) Prior Publication Data

US 2013/0106629 A1 May 2, 2013

(51) Int. Cl.
*H03M 1/12* (2006.01)

(52) U.S. Cl.
USPC ........... 341/172; 341/139; 341/144; 341/149; 341/165; 375/295

(58) Field of Classification Search
USPC .................................. 341/150–172; 375/340
See application file for complete search history.

(56) References Cited

U.S. PATENT DOCUMENTS

| | | | | |
|---|---|---|---|---|
| 4,599,604 A * | 7/1986 | McKenzie et al. | ............. | 341/153 |
| 7,928,871 B2 * | 4/2011 | Aruga et al. | .................. | 341/172 |
| 7,944,387 B2 * | 5/2011 | Ohnhaeuser et al. | ......... | 341/172 |
| 7,952,509 B2 * | 5/2011 | Aruga et al. | .................. | 341/163 |
| 7,965,218 B2 * | 6/2011 | Ohnhaeuser et al. | ......... | 341/172 |
| 8,390,490 B2 * | 3/2013 | Satarzadeh et al. | ........... | 341/155 |

OTHER PUBLICATIONS

Yang et al., "A 1 GS/s 6 Bit 6.7 mW Successive Approximation ADC Using Asynchronous Processing", IEEE Journal of Solid-State Circuits, Aug. 2010, pp. 1469-1478, vol. 45, No. 8.

Cao et al., "A 32 mW 1.25 GS/s 6b 2b/Step SAR ADC in 0.13 μm CMOS", IEEE Journal of Solid-State Circuits, Mar. 2009, pp. 862-873, vol. 44, No. 3.
Greshishchev et al., "A 40GS/s 6b ADC in 65 nm CMOS", proceedings of ISSCC 2010, Session 21 (successive approximation ADC's), Paper 21.7, pp. 390-391.
Ginetti et al., "A CMOS 13-b Cyclic RSD A/D Converter", IEEE Journal of Solid-State Circuits, Jul. 1992, pp. 957-965, vol. 27, No. 7.

* cited by examiner

*Primary Examiner* — Lam T Mai
(74) *Attorney, Agent, or Firm* — McDermott Will & Emery LLP

(57) ABSTRACT

Examples are provided for converting an analog signal to a digital signal by processing more than one bit per cycle in a number of successive approximation cycles. A system may include capacitive sub-DAC circuits and comparators. Switches may isolate the capacitive sub-DAC circuits during one or more first cycles, and merge the sub-DAC circuits during one or more last cycles. A successive approximation register (SAR) may generate digital output signals or DAC digital signals. In another example, a system may include a DAC circuit. An input capacitor may be pre-charged to at least one of an analog input signal and a DAC analog signal. A programmable gain amplifier may amplify an error signal. A multi-bit ADC may convert the amplified error signal to a multi-bit digital signal. An SAR may use the multi-bit digital signal to generate a DAC digital signal or a digital output signal.

23 Claims, 15 Drawing Sheets

MULTI-BIT SUCCESSIVE APPROXIMATION ADC

FIELD

The disclosure relates in general to analog-to-digital conversion (ADC), and more particularly to, multi-bit successive approximation ADC.

BACKGROUND

Analog-to-digital conversion (ADC) is often used to sample analog signals so that such signals may be digitally represented. The need for digital representation of analog signals arises in a variety of applications such as digital communication receivers.

A variety of techniques to perform ADC are well known in the art. Two common techniques include the successive approximation (SA) ADC and the flash ADC circuit. An SA ADC circuit generally produces a digital representation by processing an analog input signal through successive steps, at each step a comparison is performed to get a successively more accurate digital representation of the analog input signal. In a typical flash ADC circuit, an analog input signal value is compared with various reference levels, all at once, using multiple comparators. All other things being equal, because in a flash ADC circuit the signal is simultaneously compared with different reference levels in a single step, instead of in multiple steps as in an SA ADC, a flash ADC circuit may typically produce a digital representation of the analog signal with a lower latency than in a SA ADC circuit. Therefore, the flash ADC technique is generally considered more suitable for a high-speed application.

SUMMARY

Examples are provided for converting an analog signal to a digital signal by processing more than one bit per cycle in a number of successive approximation cycles. A system may include capacitive sub-DAC circuits and comparators. Switches may isolate the capacitive sub-DAC circuits during one or more first cycles, and merge the sub-DAC circuits during one or more last cycles. A successive approximation register (SAR) may generate digital output signals or DAC digital signals. In another example, a system may include a DAC circuit. An input capacitor may be pre-charged to at least one of an analog input signal and a DAC analog signal. A programmable gain amplifier may amplify an error signal. A multi-bit ADC may convert the amplified error signal to a multi-bit digital signal. An SAR may use the multi-bit digital signal to generate a DAC digital signal or a digital output signal.

It is understood that various configurations of the subject technology will become readily apparent to those skilled in the art from the disclosure, wherein various configurations of the subject technology are shown and described by way of illustration. As will be realized, the subject technology is capable of other and different configurations and its several details are capable of modification in various other respects, all without departing from the scope of the subject technology. Accordingly, the summary, drawings and detailed description are to be regarded as illustrative in nature and not as restrictive.

DETAILED DESCRIPTION

Figure 1:
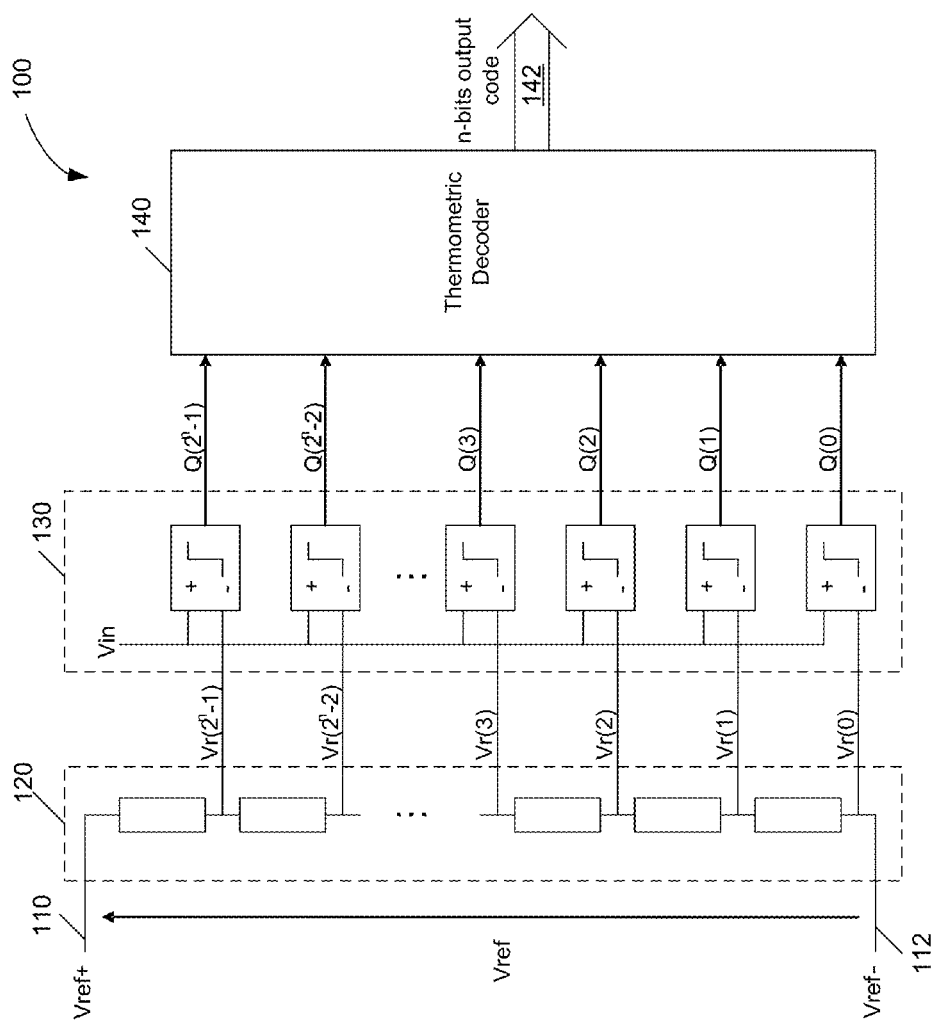
FIG. 1 is a block diagram of an example of a flash analog-to-digital converter (ADC) circuit.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known circuit elements and components are shown in block diagram form in order to avoid obscuring the concepts of the subject technology. Like components are labeled with identical element numbers for ease of understanding.

Overview

With the increasing demand for high data rates and constellation densities, especially in signals transmitted in the Giga Hertz (GHz) range, the demand for fast and accurate ADC circuits is ever increasing. With respect to SA ADC circuits, implementations using high-speed circuits with smaller chip real estate and low power consumption are desired.

In one aspect of the disclosure, a better SA ADC circuit is needed to meet the increased speed, lower power consumption, and smaller real estate requirements. Broadly and generally, in one aspect, the present disclosure provides analog-to-digital converter (ADC) circuits, methods, apparatus and systems. Broadly and generally, in one aspect, the present disclosure describes a technique to use multi-bit quantization within the loop of an SA ADC in order to accelerate the conversion by reducing the number of approximation steps. Two examples of implementations of the technique are disclosed herein.

In a first example of implementation corresponding to a capacitive charge redistribution SA ADC, the capacitive elements (e.g., a capacitive array) of the DAC circuit are grouped into several sub-DAC circuits (e.g., sub-arrays), and each sub-DAC circuit may be tied to a respective comparator to allow several comparisons to be performed in parallel, such that two or more bits can be extracted at each step. At later steps (e.g., the last few steps, such as the last step), all of the sub-arrays of capacitors can be merged together in order to form a unique feedback DAC. Consequently, in an advantageous aspect, the disclosed technique does not increase the total number of required capacitor elements (e.g., elementary capacitors), though several bits can be extracted at a time.

In a second example of implementation, the comparator circuit is replaced with PGA circuit and a flash ADC circuit, where the gain of the amplifier is gradually increased at each step of the conversion. Hence a coarser quantization may be performed in the first portion of the steps (i.e., cycles, e.g., SA cycles), and a finer quantization may be utilized for the last portion of the steps (e.g., the last one or more steps). Advantages of using a multi-bit quantization in the SA loop, with one or the other implementation disclosed above, may include allowing some decision errors to be tolerated in the first portion of the steps of the SA phase, which can be compensated in the next portion of the steps. The decision error tolerance may be realized by providing some redundancy in the technique through slightly increasing the number of comparisons performed at each step.

Nyquist rate ADCs may refer to ADCs which are used to quantify the value of a signal at well-defined points of time (e.g., sampling instants), rather than using some averaged values over a time interval. Nyquist rate ADCs, based on applied conversion techniques, may be categorized in four main types including: (1) flash ADCs; (2) pipeline ADCs (3) algorithmic ADCs; and (4) SA ADCs. These are described in detail below.

Flash ADC

Flash analog-to-digital conversion processing may be used in a variety of applications including digital communication systems and digital signal and image processing systems. One approach to ADC, particularly when high data rates are involved, may be referred to as a flash ADC. In a typical flash ADC system, an analog input signal is sampled and the amplitude of the sampled signal is compared with multiple analog reference signals, typically all at once, to generate a digital representation. For example, in an n-bits flash ADC, the input signal is simultaneously compared with $(2^n-1)$ equally spaced reference levels (e.g., voltage reference levels) in order to produce a thermometric code (e.g., digital signal) which, after decoding, gives the n-bit output code of the ADC, as illustrated in FIG. 1 described below.

FIG. 1 is a block diagram of an example of a flash ADC circuit 100, in accordance with certain configurations of the present disclosure. Flash ADC circuit 100 includes a reference voltage divide circuit 120, a comparator circuit 130, and a thermometric decoder 140. Reference voltage divide circuit 120 divides a reference voltage, Vref, applied to ports 110 and 112 of reference voltage divide circuit 120 into a number (i.e., n, e.g. 6, 8, 16, etc.) of sub-reference voltages, Vr(0)–Vr($2^n$–1). Each of sub-reference voltages is compared, by a comparator of comparator circuit 130, with the input analog signal Vin. The comparison results, Q(0)–Q($2^n$–1), are received by thermometric decoder 140 and converted to an n-bit output signal 142.

The drawback of this architecture is that comparator circuit 130 needs to have a high number of comparators and the offset voltages of the comparators is required to be less than half of the value of the least significant bit (LSB) of the input signal. Otherwise, the output code 142 of the comparator circuit 130 may not be guaranteed as a thermometric signal and the monotonicity of the conversion may not be ensured. Therefore, the application of this architecture may be limited to low resolution (e.g., less than six bits) conversions.

Pipeline ADC

Figure 2:
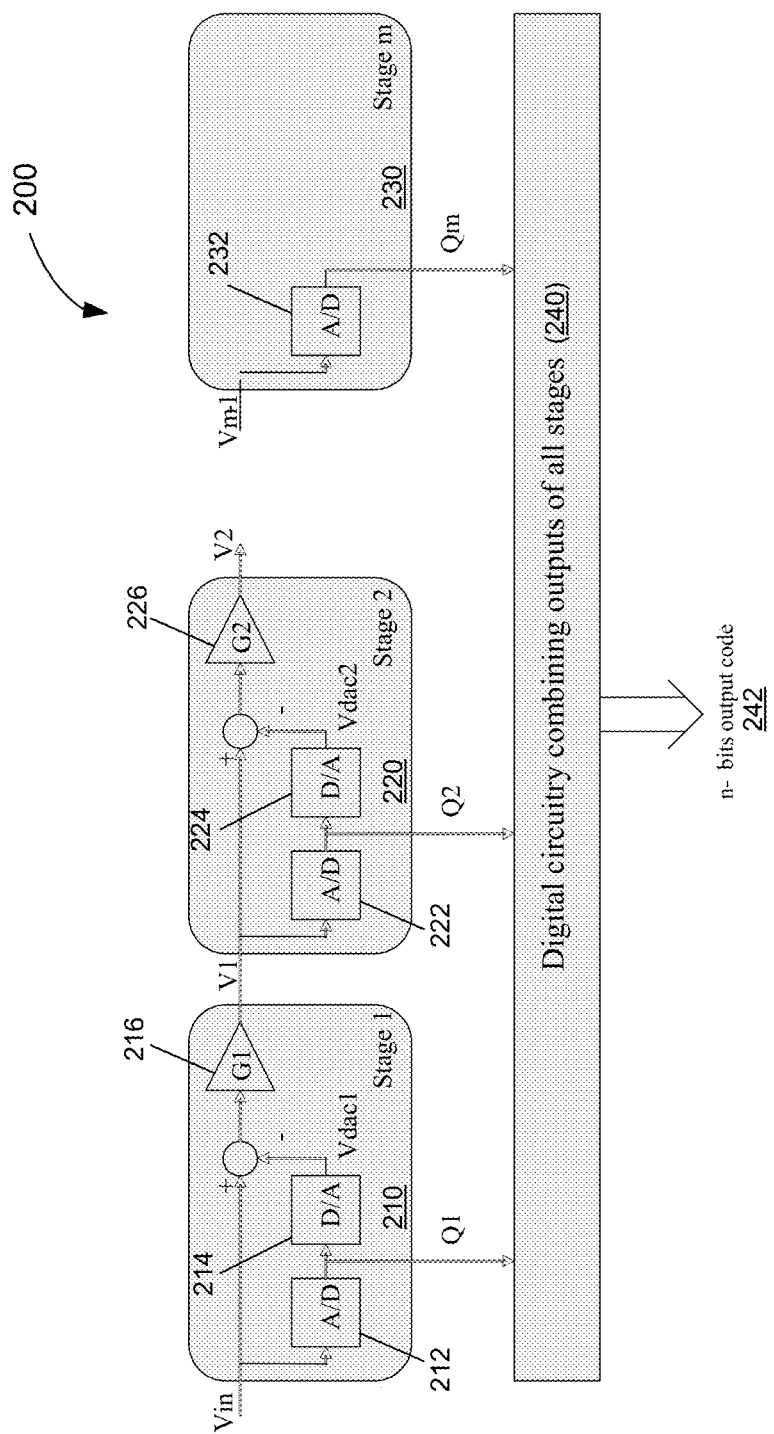
FIG. 2 is a block diagram of an example of a pipeline ADC circuit.

To achieve higher resolutions, the conversion may be realized in several steps through a pipeline ADC, where each stage of the pipeline may extract one or more bits, as illustrated in FIG. 2 and described below.

FIG. 2 is a block diagram of an example of a pipeline ADC circuit 200, in accordance with certain configurations of the present disclosure. Pipeline ADC circuit 200 includes a number of stages (e.g., stages 210, 220, and 230) and a digital combining circuit 240. In each stage (e.g., one of stages 210, 220, or 230), the input signal (e.g., one of Vin, V1, V2, or Vm−1) may first be sampled and then quantified by a coarse ADC (e.g., a small flash ADC with low resolution, such as one of 212, 222, or 232) in order to obtain a coarse code Qi (e.g., Q1, Q2, . . . , Qm). This digital estimation of the signal (i.e., Qi,) may then be reconverted back into the analog domain (e.g., signals Vdac1 or Vdac2) by a feedback DAC (e.g., one of 214, or 224), and then subtracted from the sampled input signal of the stage (e.g., one of Vin, V1, V2, or Vm−1). The result of the subtraction may be amplified with a gain stage Gi (e.g., gain stages G1-216 or G2-226), in order to obtain a residue voltage Vi (e.g., V1, V2, or Vm−1), which may be interpreted an image of the quantization error at the output of the i-th gain stage Gi. By evaluating this quantization error in the next stage of the pipeline, the estimation can be refined. For the last stage of the pipeline (i.e., stage 230), however, the quantized signal may not be reconverted back into analog to generate a residue voltage (e.g., Vm), as this residue voltage is not processed any further.

Given the range of the input signal voltage (e.g., Vin) of the ADC is, for example, between 0V and Vref, and if this range also corresponds to the range of input voltage of coarse ADCs (e.g., one of 212, 222, or 232) within each stage, the output range of each DAC (e.g., 214, or 224) is also between 0 and Vref, and the output voltage Vdaci in each stage is equal to Qi*Vref, with Qi being the output code of the ADC of the i-th stage (i.e., also the input code of the DAC). Thus, one has:

$$V1 = G1*(Vin - Vdac1) = G1(Vin - Q1*Vref)$$

$$V2 = G2*(V1 - Vdac2) = G2(V1 - Q2*Vref)$$

$$V3 = G3*(V2 - Vdac3) = G3(V2 - Q3*Vref)$$

Reverting these equations gives:

$$Vin = Vref*Q1 + V1/G1$$

$$V1 = Vref*Q2 + V2/G2$$

$$V2 = Vref*Q3 + V3/G3$$

and combining these equations results in:

$$Vin = Vref*(Q1 + Q2/G1) + V2/(G1*G2)$$

On the other hand, if a 3d pipeline stage is also taken into account:

$$Vin = Vref*(Q1 + Q2/G1 + Q3/(G1*G2)) + V3/(G1*G2*G3).$$

Practically, the gain G1 and G2 for the residue amplifiers 216 and 226 are analog gains (e.g., ratio of capacitor values) but correspond nominally to an integer number, generally even to powers of 2 (neglecting the mismatches and gain errors), so that they can easily be mapped into the digital domain as multiplying factors in the digital circuitry combining the outputs from the different stages. Thus if the output code is computed in the digital domain as:

Code=$K1*Q1+K2*Q2+K3*Q3$ with K1=1, K2=K1/G1=1/G1, and K3=K2/G2=1/(G1*G2), one obtains:

Vin=$Vref*Code+V3/(G1*G2*G3)$.

which indicates that the output code is proportional to the input signal voltage and thus can represent the input signal voltage, with a quantization error proportional to V3/(G1*G2*G3) that represents the residue of the last stage (which does not need to be implemented). The gain performed in each stage generally corresponds to $2^k$, where k is the number of bits solved in the stage, so that the quantization error referred to the input becomes smaller and smaller when increasing the number of stages. For instance if two bits are resolved per stage, the residue can be amplified by four in each stage.

With the pipeline ADC circuit 200, the precision is not limited by the precision of the coarse ADC (i.e., thresholds of the comparators), as, by using redundancy techniques, small errors at the decision in the first stages can be compensated in the following stages. However, the precision is strongly constrained by the precision of the DACs (e.g., 214 or 224) in the feedback path of each stage and by the precision of the gains of the residue amplifier Gi (e.g., 216 or 226). Given that, for instance, a 10-bit resolution is desired, and that 2 bits are extracted from the first stage. This implies that the residue V1 of the first stage is evaluated with a precision of 8 bits, which indicates that the gain error for the gain G1 of the first gain stage 216 has a precision roughly better than 1/256=0.4%. This may impose severe constraints on the settling of the residue amplifier, mainly when operating at high speeds.

Algorithmic ADC

Algorithmic ADC is similar to the pipeline ADC, with the difference that there is only a single stage implemented, which successively performs, by time-sharing, the function of first, second, ... and up to the last stage of the pipeline. Thus, the output of the amplifier at time k acts as the input of the same block at time step k+1. This reduces the throughput of data that can be sampled by the algorithmic ADC, as the same block successively performs the different steps of the conversion algorithm before taking a new sample of the input voltage. Thus the algorithmic ADC is better suited for small real estate applications, but not for high-speed operations.

SA ADC

Figure 3:
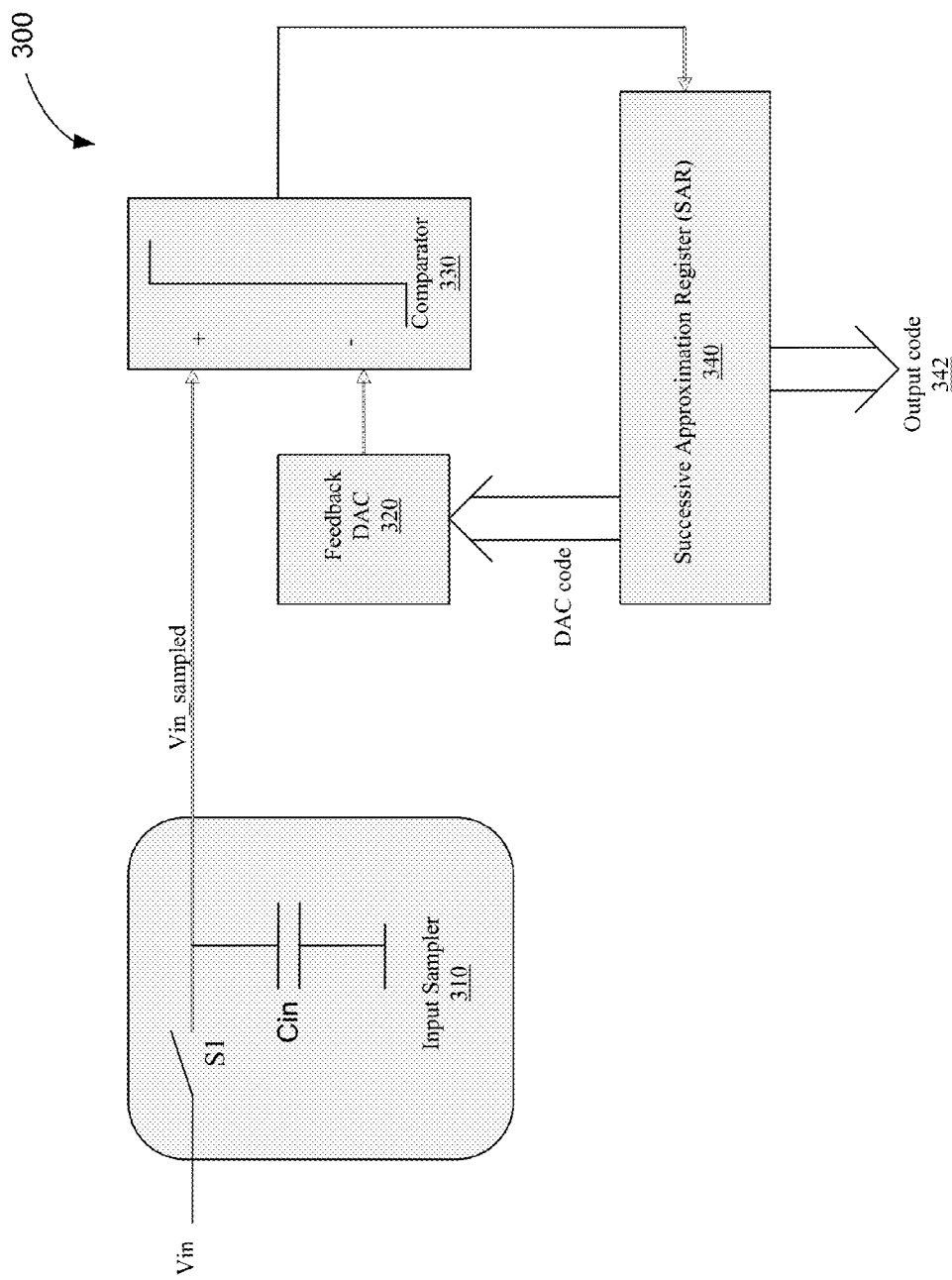
FIG. 3 is a block diagram of an example of a successive approximation (SA) ADC circuit.

An advantage of an SA ADC is that no residue amplification is required, because the conversion is realized in a single stage as shown in FIG. 3 and described below.

FIG. 3 is a block diagram of an example of an SA ADC circuit 300, in accordance with certain configurations of the present disclosure. ADC circuit 300 may include an input sampler 310, a feedback DAC 320, a comparator 330 and an SAR 340. Input sampler 310 may include a switch S1 and a capacitor Cin and can be configured to sample the input signal voltage (e.g., Vin) to generate the sampled input signal voltage, which may be compared with output signal of feedback DAC 320, by comparator 330. SAR 340 generates the successive input codes of feedback DAC 320, with respect to which the sampled input signal voltage can be compared. SAR 340 receives the comparison result and based on the received comparison result determines the output code 342.

The operation of ADC circuit 300 includes finding a DAC level that best approximates the sampled input signal voltage and generally results in a dichotomy. In one aspect, the operation of ADC circuit 300 consists of finding a DAC level that best approximates the sampled input signal voltage. Consider, for example, a scenario in which the range of the input signal voltage of ADC circuit 300 and the output range of the feedback DAC 320 are between zero and Vref and the resolution of the ADC circuit 300 and of the feedback DAC 320 is 8 bits. In this scenario, at the beginning of the operation, the input voltage is known to be in the range between 0 and Vref. At the first step, the input signal voltage is compared with Vref/2 by applying a DAC code 1000 0000 to the feedback DAC 320. If the resulting bit (e.g., output of comparator 330) is high, then the input signal voltage is known to be higher than Vref/2 and thus between Vref/2 and Vref, otherwise the input signal voltage is between zero and Vref/2. The uncertainty (i.e., the interval that the input voltage is known to be in) is thus reduced by a factor of two. For instance, if the first bit was zero, the next code applied to the feedback DAC 320 is 0100 0000 in order to generate voltage Vref/4, which the input voltage will then be compared with. If the second bit is low, the input voltage is known to be in the interval from zero to Vref/4, otherwise in the interval between Vref/4 and Vref/2, and the uncertainty is again reduced by a factor of two. In the last case, for example, the third code applied to the feedback DAC 320 is 0110 0000, which generates a voltage level of 3/8*Vref, and so on. Consequently, at each step, one bit is solved and the uncertainty is divided by two. An example of implementation of such SA ADC is based on switched capacitors, as shown in FIG. 4 discussed herein.

Switched Capacitor Implementation of SA ADC

Figure 4:
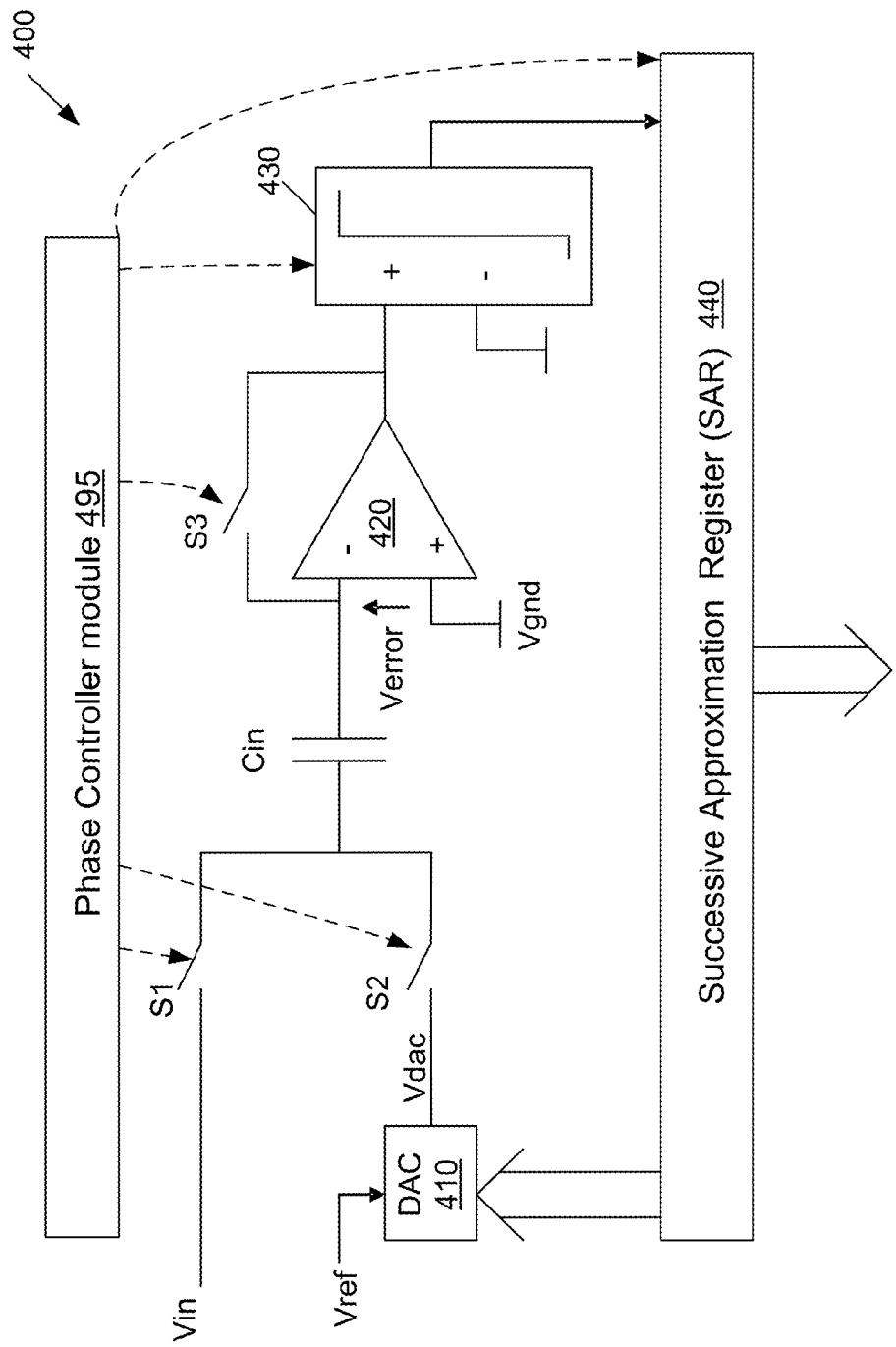
FIG. 4 is a block diagram of an example of a switched capacitor SA ADC circuit.

FIG. 4 is a block diagram of an example of a switched capacitor SA ADC circuit 400, in accordance with certain configurations of the present disclosure. ADC circuit 400 may include a DAC 410, switches S1, S2, and S3, an input capacitor Cin with a capacitance Ci, an amplifier 420, a comparator 430, and an SAR 440. During a precharge phase 1, switches S1 and S3 are closed, and the input capacitor Cin is precharged to the input voltage Vin, by connecting one electrode of the input capacitor Cin to the input signal Vin, while the other electrode of capacitor Cin is tied to the virtual ground Vgnd of amplifier 420, which, in this phase, is set in closed loop by switch S3 around a feedback path. When the positive input of amplifier 420 is tied to a voltage Vgnd, the negative input of amplifier 420 or virtual ground is thus at the same voltage Vgnd, given the offset voltage of this amplifier is neglected. At the end of the precharge phase, switches S1 and S3 open, so that the charge Q=Ci*(Vin−Vgnd) across input capacitor Cin is frozen, while the amplifier is set in open loop and acts as a comparator (e.g., as a first stage of a comparator) in order to perform the SA phase. The input capacitor Cin is then coupled to DAC 410 by closing switch S2. As the voltage difference (Vin−Vgnd) across capacitor Cin is forced to remain constant, (because there is no discharge path), the voltage on an electrode of capacitor Cin, which is tied to the negative input of amplifier 420 (now acting as a comparator) is equal to Vdac−Vin+Vgnd, and the differential error voltage Verror between both input of the first stage of comparator (i.e., amplifier 420 set in open loop) is thus equal to Verror=Vdac−Vin. The difference between Vin and Vdac is, thus, directly achieved by switching the voltage on the right-side electrode of capacitor Cin from Vin to Vdac, while maintaining a constant charge (thus a constant voltage) across capacitor Cin.

The ADC circuit 400 may also include a phase controller module 495 configured to control switches S1, S2, S3 and items 430 and 440 ("controlled components A") to allow the controlled components A to perform, among others, some or all of the functions described above. An amplifier 420 may be sometimes referred to as a switched amplifier or an amplifier circuit.

Figure 5:
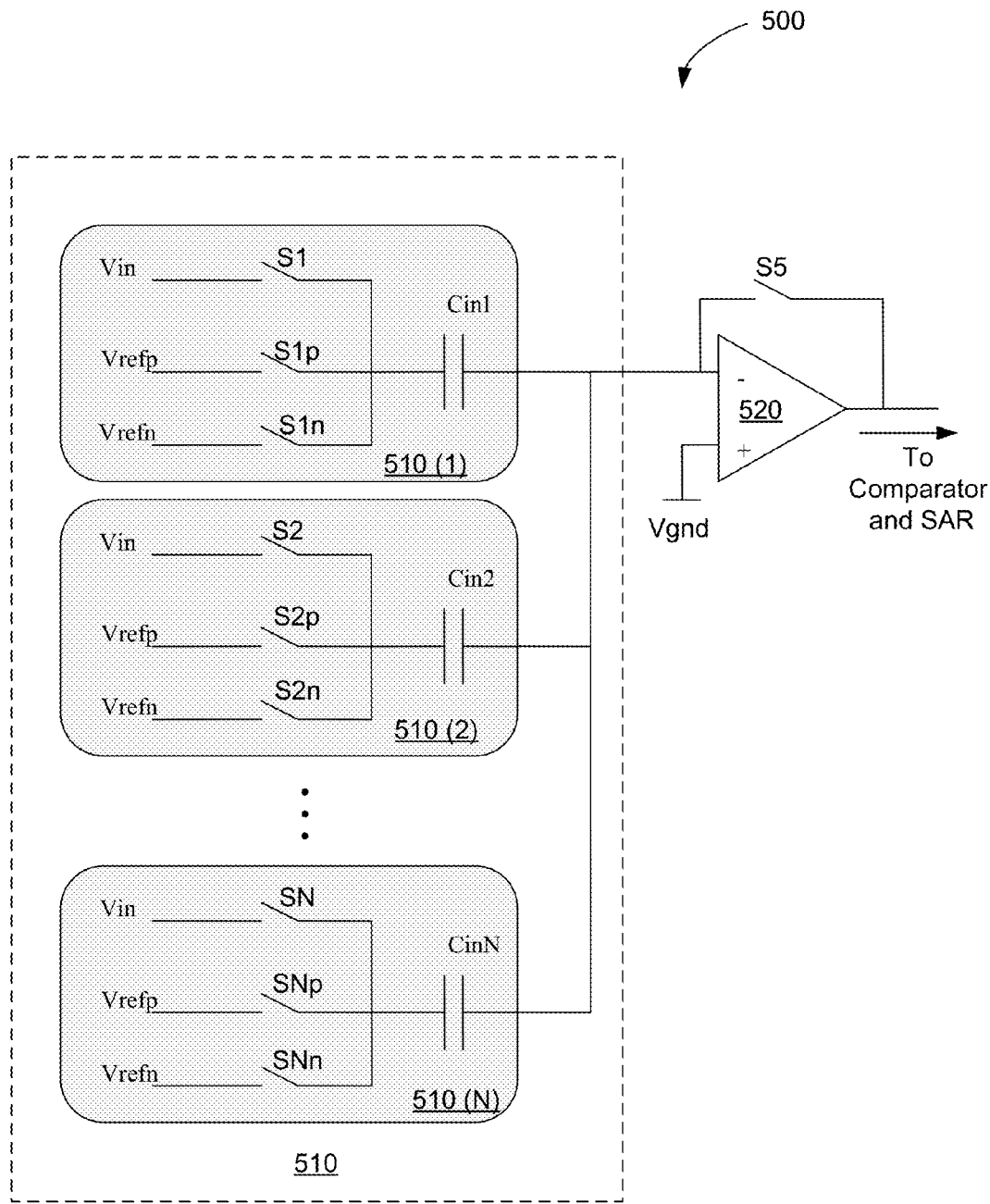
FIG. 5 is a block diagram of an example of a charge-redistribution switched capacitor SA ADC circuit.

Switched Capacitor Implementation of SA ADC with Charge Redistribution Based on Capacitive DAC FIG. 5 is a block diagram of an example of a charge-redistribution switched capacitor SA ADC circuit 500, in accordance with certain configurations of the present disclosure. In FIG. 5, for simplicity, corresponding comparator, SAR and phase controller circuits of ADC circuit 500 are not shown. An amplifier 520 is similar to an amplifier 420 in FIG. 4. In ADC circuit 500, instead of generating a voltage Vdac to be applied to an input capacitor (such as input capacitor Cin of FIG. 4), in the SA phase, input capacitor Cin of FIG. 4 is decomposed into groups of capacitors (e.g., capacitor arrays Cin1, Cin2, CinN) to realize a capacitive DAC 510. Capacitor arrays (e.g., Cin1, Cin2 . . . or CinN) can be independently connected to a positive reference voltage Vrefp or a negative reference voltage Vrefn (e.g., including zero or ground potential), so that DAC 510 is realized with control over the number of capacitor arrays in the array that are tied to Vrefp or Vrefn. Each of capacitor arrays may be made of an arbitrary number of identical elementary capacitors, so that the capacitor array can be formed by unary capacitors, of binary capacitors, or both.

One advantage of the SA ADC is that there is no need to re-amplify precisely the residue voltage (i.e., a voltage difference between input voltage Vin and Vdac of DAC 410 of FIG. 4) in order to quantify the residue voltage, as the information is in the sign of this residual error voltage. Moreover, in one aspect, as the input signal voltage is always compared to the different levels by the same comparator (comparator 430 of FIG. 4), contrary to the flash ADC (see FIG. 1), there is no matching issue between different comparators. In an SA ADC, an offset of the comparator would simply result into an overall offset of the characteristics of the ADC, but would not impact its resolution. For precise resolution requirements, the comparator has a low noise and a hysteresis level inferior to one LSB. The precision of an SA is basically determined by the precision of the feedback DAC (e.g., capacitive DAC 510), typically defined by matching between the capacitors of the capacitor arrays in a charge redistribution ADC. For the aforementioned reasons, the SA may commonly be used in applications involving operations at high speed (e.g., of the order of one GS/s). Faster ADC circuits (e.g., a few tens of GS/s) may even be realized by interleaving a large number of SA ADC circuits.

The drawback, however, of an SA ADC is that, as only one bit is calculated per SA step, the required number of steps per conversion corresponds to the number of bits of the SA ADC. Hence, for an 8-bit SA ADC, less than 1/8 of the conversion time is allocated to each SA step, as some time is also allocated to the precharge phase. For high speed ADCs (e.g., one GS/s and above), this imposes severe constraints on the settling of the DAC and on the speed of the comparator, thus affecting the power consumption. In comparison, pipeline ADCs perform a conversion at each clock cycle, and each stage may perform multi-bit quantization.

In one aspect, a DAC 510 includes the functionality of DAC 410 of FIG. 4.

Various configurations in the present disclosure provide solutions to reduce the number of steps in an SA ADC by processing more than one bit per SA cycle (or SA step). An exemplary solution to realize multi-bit SA ADCs is shown in FIG. 6 and discussed below.

Example of 6-bit ADC

Figure 6:
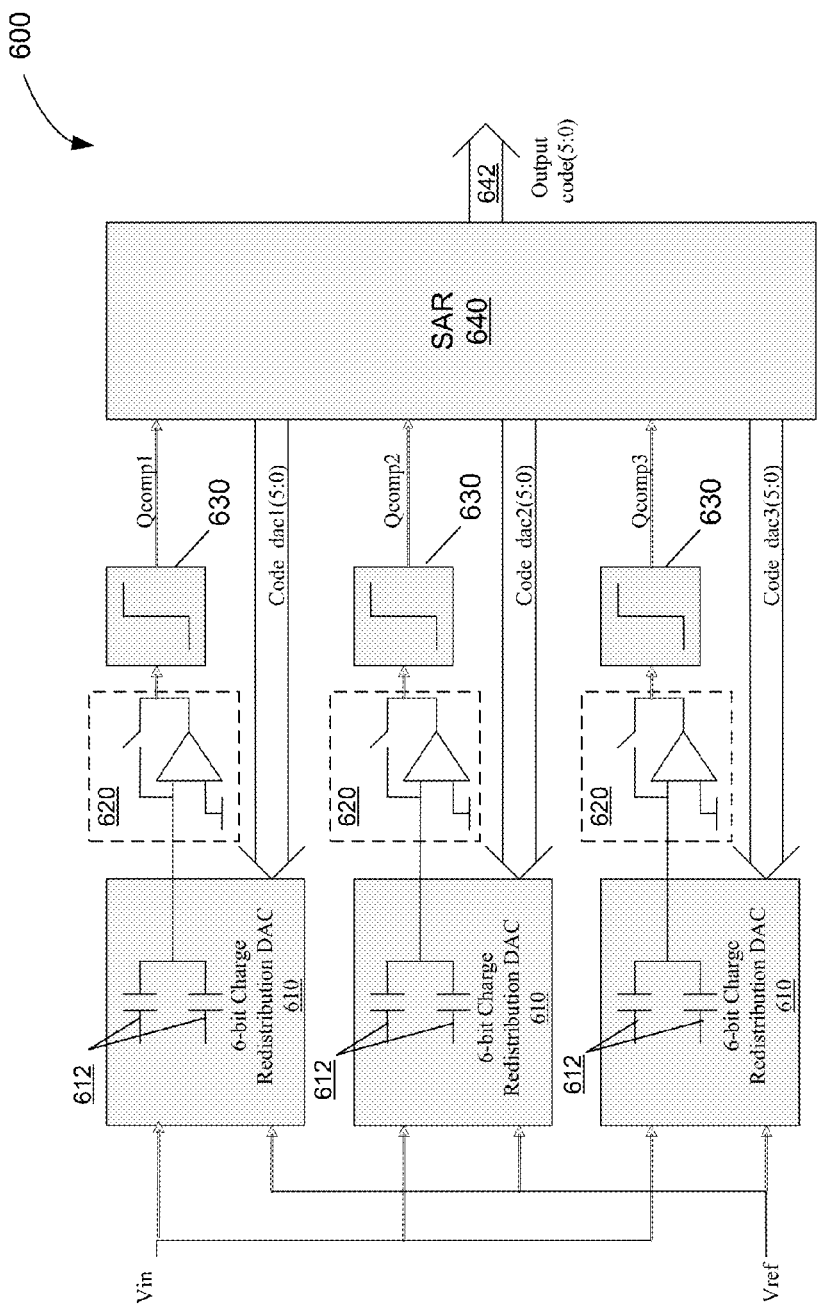
FIG. 6 is a block diagram illustrating an example of implementation of a 6-bit ADC with additional hardware configured to compute two bits at a time.

FIG. 6 is a block diagram illustrating an example of implementation of a 6-bit ADC circuit 600 with additional hardware configured to compute two bits at a time, in accordance with certain configurations of the present disclosure. The 6-bit ADC 600 may include a number of (e.g., 3) 6-bit charge redistribution DACs 610, switched amplifier circuits 620, comparators 630 and an SAR 640. Each of capacitive arrays 612 of 6-bit charge redistribution DAC 610 (hereinafter "DAC 610") may comprise an array of elementary capacitors which are precharged to the input signal voltage Vin in the first phase.

After the precharge phase, the operation of each DAC 610 is similar to the operation of DAC 410 of FIG. 4 described above. During a first phase, the input signal voltage Vin is sampled simultaneously on the three capacitive arrays 612. As the ADC circuit 600 operates as a 6-bit ADC, the output code is between 0 and 63. As two bits are processed per SAR cycle, the uncertainty in the interval in which the input signal voltage is known to be included is divided by four at each step, and hence the interval in which the output code resides is also divided by four. Initially, for the output code, a value in the interval [0, 64[ is used. The notation "[m, n[" can be understood as between m and n, including m and excluding n. In order to divide the uncertainty by four, the input signal voltage is simultaneously compared during a first SAR cycle to voltages corresponding to DAC codes 16, 32, and 48 by the three DACs 610 and comparators 630. This is achieved by applying codes 16, 32 and 48 to the 3 DACs 610. If the input signal voltage is between 39 and 40, the three comparators 630 indicate that the signal corresponds to a code larger than 16, larger than 32 and smaller than 48. Thus, after the first SAR step, the code is known to be in the interval [32, 48[, which is 4 times smaller than the initial interval [0, 64[. In the second SAR cycle, the resulting interval [32, 48[ is again divided by four. This is achieved by applying codes 36, 40 and 44 to the three DACs 610. As the input signal voltage corresponds to a code between 39 and 40, the three comparators will then indicate that the code is above 36, below 40, and below 44, and thus in the interval [36, 40[, which is again four times smaller than the interval resulting from the first SAR cycle.

In the third and last SAR cycle, the interval [36, 40[ is again divided by 4 in order to obtain the LSBs by comparing simultaneously with codes 37, 38, and 39. The comparators 630 indicates, in this case, that the input signal voltage is higher than DACs 610 voltages corresponding to codes 37, 38, and 39, thus, corresponds to an input code between 39 and 40, which, rounded down, gives a value of 39 for an output code 642 of the ADC circuit 600. In a classical one bit per SA cycle implementation, a single comparator and a single 6-bit capacitive DAC made of 64 elementary capacitors is used. Whereas, in ADC circuit 600, where two bits are computed at each cycle, three 6-bit capacitive DACs 610 and three comparators 630 are operated in parallel, which is a large penalty in terms of real estate and power consumption.

An ADC 600 may also include a phase controller block (such as the item 495) to control some or all of the components shown in FIG. 6.

An advantage of the aspects disclosed below as alternative methods of analog-to-digital conversion is that the disclosed aspects allow processing more than one bit per cycle, without multiplying the area of the capacitive DAC or having several full DACs operating in parallel. Another advantage of the disclosed aspects is to include redundancy in the SA algorithm, such that small decision errors in the first steps of the algorithm can be corrected in the last one or more steps.

ADC with Splitted Capacitive Array

Figure 7:
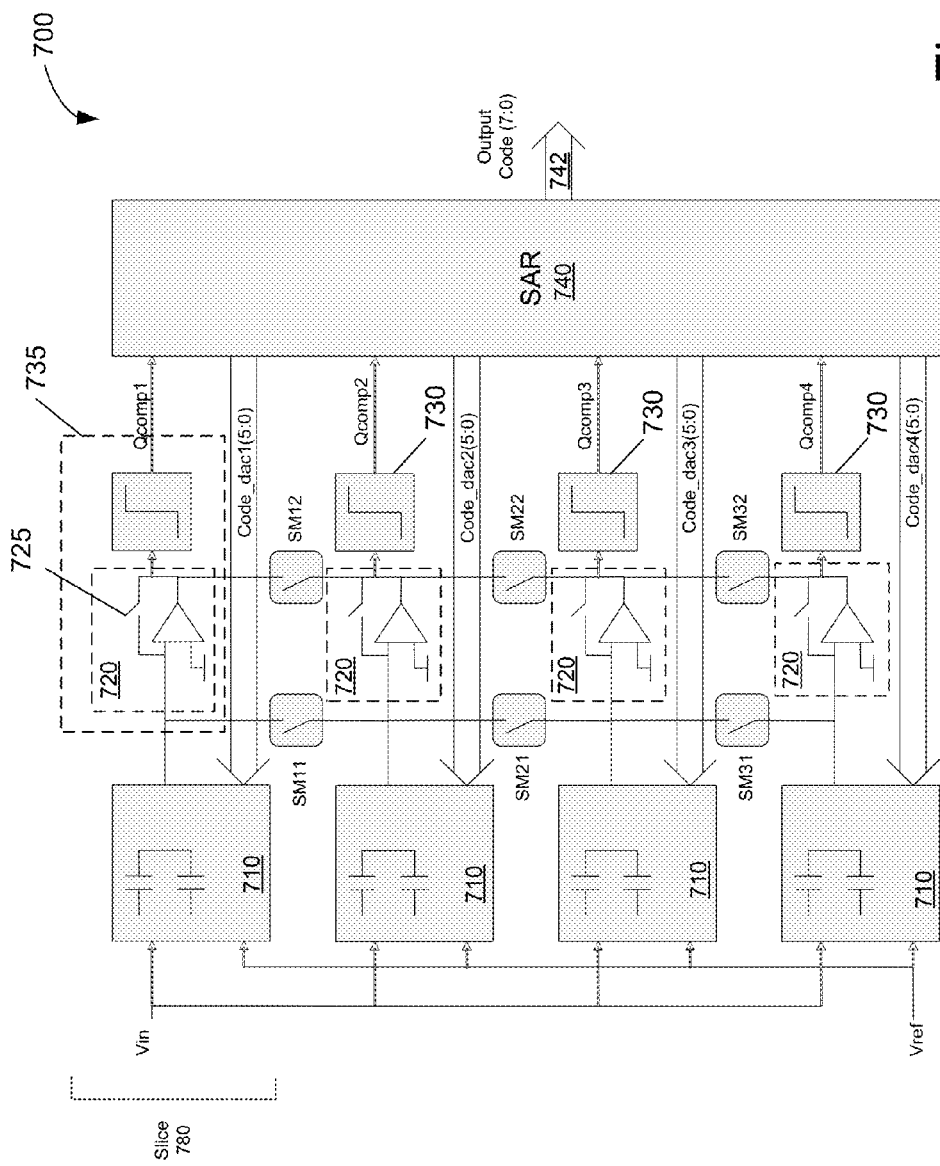
FIG. 7 is a block diagram illustrating an example of implementation of an 8-bit ADC by splitting an 8-bit DAC array into four 6-bit Arrays for a number of cycles.

In order to achieve an n-bits SA ADC circuit, instead of having several n-bit DACs in parallel, each exercising different n-bit codes, and several comparators (e.g., as used in ADC 600 of FIG. 6, where three full 6-bit DACs in parallel were used to realize a 6-bit ADC), the whole capacitive array can be split into smaller arrays with lower resolution for a first portion of SA cycles, and merged back for the one or more last SA cycles, as shown in FIG. 7 and described below. In one aspect, the whole capacitive array is merged for at least the one last SA cycle.

FIG. 7 is a block diagram illustrating an example of implementation of an 8-bit ADC circuit 700 by splitting the 8-bit DAC array into four 6-bit Arrays 710 for a number of cycles, in accordance with certain configurations of the present disclosure. The 8-bit ADC circuit 700 (hereinafter "ADC 700") may include 6-bit capacitive charge redistribution sub-DACs (hereinafter "sub-DACs 710"), switches SM11, SM12, SM21, SM22, SM31, and SM32, switched amplifiers 720, comparators 730, and an SAR 740. The operation of ADC 700, with an input signal voltage ranging from the ground potential (i.e., 0V=Vrefn) to Vrefp, is based on calculating two bits per SA step, at least for the first SA steps. In the example described herein, the input signal voltage Vin corresponds to 141.2/256*Vref, so an 8-bit output code 742 of 141 is expected to be found. In order to achieve an 8-bit ADC, an 8-bit DAC is thus required, with 256 elementary capacitors, which are grouped into four sub-DACs 710 each including 64 elementary capacitors (for simplicity, only two are shown). In order to compute 2 bits per cycle, three comparisons are performed per cycle. However, instead of having three 8-bits DAC's in parallel, as would be needed if the configuration of FIG. 6 was to be used, the total array of the 8-bit DAC with 256 elementary capacitors is split into four sub-DACs 710, each operating as a 6-bit DAC. At any cycle, three different codes may be exercised on three of the four sub-DACs 710, with three resulting comparison bits. To simplify the implementation, one comparator 730 is associated with each sub-DAC 710, so that each sub-DAC 710 can be operated with an input code, during the first cycle, in which three comparators are used.

The input voltage signal is first sampled into four 6-bit sub-DACs 710. The first 6 bits are computed as described with respect to FIG. 6. For the first SA cycle, in order to divide the uncertainty on the input voltage signal by 4, the input voltage signal may be compared with the following references: 1/4*Vref, 2/4*Vref, and 3/4*Vref. This can be realized by applying codes 16=1/4*64, 32=2/4*64, and 48=3/4*64 onto three of the four sub-DACs 710 (e.g., as Code_dac1, Code_dac2, and Code_dac3 generated by SAR 740). As the input voltage signal is equal to 141.2/256*Vref=35.3/64, the input signal voltage is then known to be in the interval between 2/4*Vref and 3/4*Vref, so that the corresponding 6-bit code is expected to be within the range of 32-48.

In the second SA cycle, the interval between 2/4*Vref=32/64*Vref and 3/4*Vref=48/64*Vref is again divided by four by exercising codes 36, 40 and 44 onto three of the four sub-DACs 710. As the input signal voltage is 35.3/64*Vref, the interval for the 6-bit code to be found is limited to the range [32, 36[.

In the third SA cycle, the input signal voltage is compared with 33/64*Vref, 34/64*Vref, and 35/64*Vref, by applying codes 33, 34 and 35 to the three different sub-dacs 710. The input signal voltage is then known to be in the interval between 35/64*Vref and 36/64*Vref, thus between 140/256*Vref and 144/256*Vref, so that the output code 742 is in the interval [140, 144[, indicating that the six most significant bits (MSBs) are already determined after three steps. In order to find the two last bits (i.e., LSBs), the four sub-DACs 710 are merged into a single 8-bit DAC through interconnecting switches SM11, SM21 and SM31. At this point, the ADC 700 operates as a classical SAR computing one bit at a time. To divide the interval [140, 144[ by 2, first, an 8-bit code corresponding to 142 is applied. This is achieved by applying code 35 to two of the four sub-DAC 710, and code 36 is applied to the other two sub-DACs 710, resulting in a code 142=35+35+36+36 for the overall 8-bit DAC formed by sub-DACs 710.

Because outputs of sub-DACs 710 are interconnected via switches SM11, SM21, and SM31, the input ports of comparators 730 are effectively shorted together, so comparators 730 give the same result, if they have zero or negligible offset. Therefore, any of the comparators 730 can be used to determine whether the signal is smaller or larger than 142/256*Vref. At the end of this step, it is found that the input voltage is smaller than 142/256*Vref, so the 8-bit output code 742 to found is expected to reside the range [140, 142[.

In certain configurations of the present disclosure, a higher precision can also be obtained by interconnecting comparators 730 in parallel in order to average their noise and offset voltage, for instance, by means of switches SM12, SM22 and SM32 (output nodes and some internal nodes may also be interconnected, but not shown in FIG. 7 for simplicity).

For the last SA step, the code 141 is exercised by applying code 35 to three of the sub-DACs 710, while code 36 is exercised to the last one, resulting in a code 141=35+35+35+36. The comparison results then indicate that the input voltage is in the range between 141/256 and 142/256, resulting in the 8-bit output code of 141, namely the expected value.

In the above example, the eight bits of the output code 742 are obtained, without increasing the number of capacitors, in five steps instead of eight steps, as two bits per step are obtained for steps 1, 2 and 3, and a single bit per step is obtained for the last two steps 4 and 5.

In one aspect, it may be important that comparators 730 have the same offset values; however, a relative offset between comparators 730 may be observed when their inputs are shorted together, by comparing their outputs. If one comparator's output is generally higher than the others, while their inputs are shorted together, this indicates that the offset of that particular comparator is lower than the others. These offset errors can be compensated for by, for example, a feedback loop adjusting the offset. In one instance, a feedback loop comprising a DAC can be placed between an output node and an input node of each switched amplifier 720. While this feedback loop is not shown in FIG. 7 simply not to complicate the drawing, its existence is understood from the foregoing sentence.

In the above example, the output code is achieved by certain number of decisions, but no redundancy is provided. In one aspect, if all the decisions taken in the implementation are exact, there would not be a need such redundancies to be included in the process.

ADC with Splitted Capacitive Array and Redundancy

It may be desirable to include the possibility of correcting a wrong decision taken in an earlier step. For instance, if in the first step, comparison results erroneously indicate that the signal is below Vref/2=128/256*Vref, it is not possible to finally converge to an output code value equal to or above 128. In order to allow for decision error tolerance, some redundancy is added by increasing the number of comparisons to perform. In order to add redundancy, benefit can be obtained from the fourth sub-DAC 710 of FIG. 7 and one of comparators 730 of FIG. 7 in order to exercise a fourth code at each step. Conventional and additional comparisons can be implemented by using comparison levels shown in FIGS. 8 and 9, described below.

Additional Description Regarding ADC with Splitted Capacitive Array

In one aspect, an ADC circuit 700 in FIG. 7 may include a phase controller module 795 to control at least some of the components shown in FIG. 7 such as switches SM11, SM12, SM21, SM22, SM31, and SM32, switched amplifiers 720, comparators 730, and SAR 740 ("controlled components B") to allow the controlled components B to perform, among others, some or all of the functions described above. While the controlling connections are not explicitly shown in FIG. 7 simply not to complicate the drawing, such connections exist between 795 and each of the controlled components B (in a manner similar to FIG. 4), and these connections are considered to be depicted.

In one example, each sub-DAC 710 may comprise item 510 in FIG. 5, and may include binary capacitors, unary capacitors or a combination of both. In another example, each sub-DAC 710 may comprise components 51, S2, 410 and Cin shown in FIG. 4.

In one aspect, the switched amplifiers 720 and comparators 730 together may be viewed as comparators 735. For brevity, only one comparator 735 is identified with a dotted box in FIG. 7. Each of switched amplifiers 720 may be viewed as a pre-amplifier in which during a first phase (when each shunt switch 725 within a switch amplifier 720 is closed), the pre-amplifier can act as an auto-zeroing amplifier as it shorts out the input and output of the pre-amplifier. During a second phase (when each shunt switch 725 within a switched amplifier 720 is open), the pre-amplifier can act as a fixed-gain amplifier having a high gain; however, the gain does not need to be precise. In one aspect, a comparator 730 may be implemented with a latch.

In an alternative configuration, output-node switches (not shown in FIG. 7 but similar to input-node switches SM12, SM22 and SM32) can be placed at the outputs of the comparators 730 so that when the output-node switches are closed, the outputs of the comparators 730 are shorted together. While the output-node switches are not shown simply to avoid complicating the drawing, they can be placed in FIG. 7 just like SM12, SM22 and SM32, except at the outputs of the comparators 730 instead of at the inputs of the comparators 730.

In one aspect, an ADC circuit 700 may be viewed as comprising multiple slices 780, multiple switches such as SM11, SM12, SM21, SM22, SM31, and SM32, an SAR 740, and a phase controller module 795. Each slice 780 may comprise a DAC 710, an amplifier 720 and a comparator 730. In one advantageous example, to generate an n-bit output code 742 out of SAR 740 using p number of bits per SAR cycle, the minimum number of slices 780 (or the minimum number of comparators 730) may be obtained by subtracting 1 from 2 to the power of p, which can be expressed as $(2^p)-1$, where n and p are positive integers, p is less than n, and p is greater than 1. To have redundancy, the minimum number of slices 780 (or the minimum number of comparators 730) would be greater than $(2^p)-1$. For instance, if n is 8, p is 2, and no redundancy is used, then the minimum number of slices 780 (or the minimum number of comparators 730) is 3, which is calculated from $(2^2)-1$. In the example shown in FIG. 7, n is 8, p is 2, and it has redundancy. Thus, in FIG. 7, the number of slices 780 (or the number of comparators 730) is greater than 3, and in this example, the ADC circuit 700 has one more slice (or one more comparator), and hence the number of slices (or the number of comparators) for ADC circuit 700 is 4. In one aspect, the number of slices and the number of comparators are equal. In one advantageous aspect, the maximum number of slices (or the maximum number of comparators) needed is less than $(2^n)-1$.

Voltage-Interval Division Schemes

Figures 8, 9:
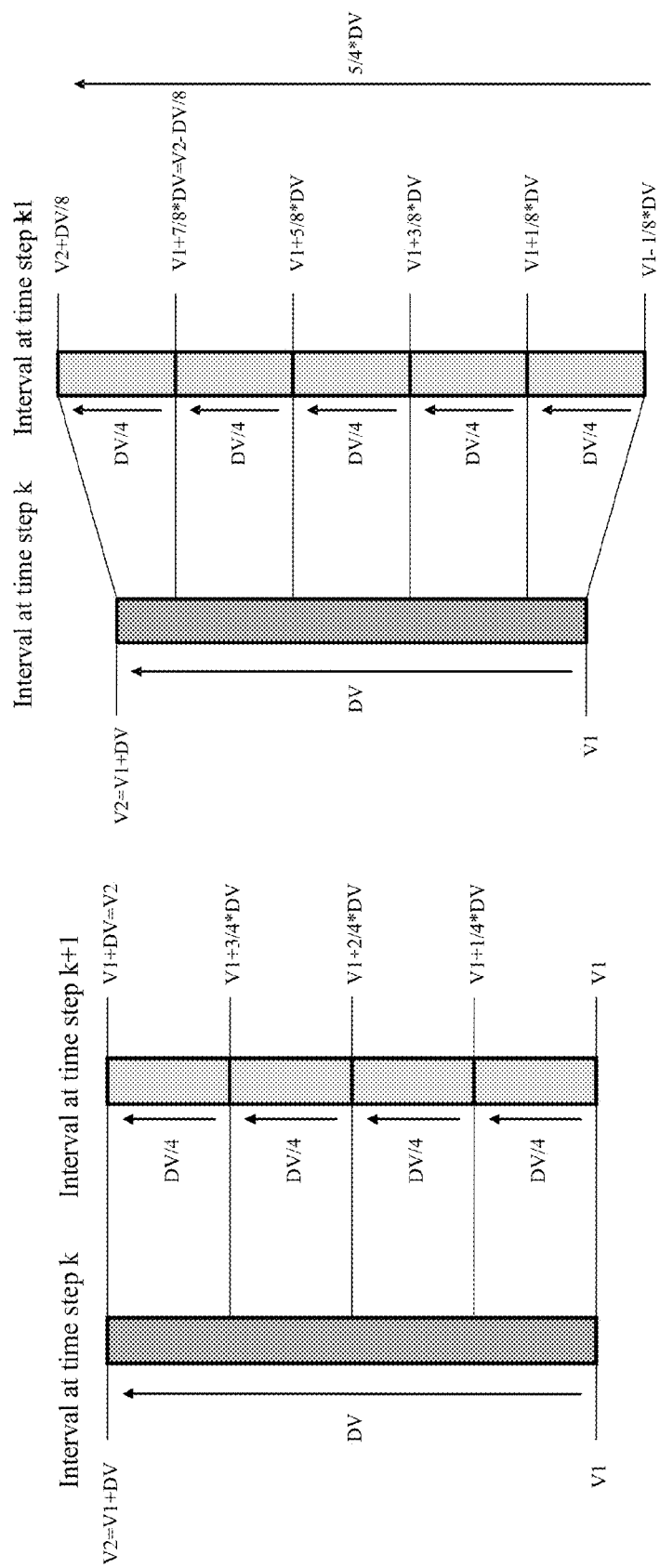
FIG. 8 is a diagram illustrating an example of a voltage-interval division in subsequent cycles.
FIG. 9 is a diagram illustrating an example of an improved voltage-interval division scheme allowing tolerance to decision errors.

FIG. 8 is a diagram illustrating an example of a voltage-interval division in subsequent cycles, in accordance with certain configurations of the present disclosure. The voltage interval DV shown in FIG. 8 depicts an interval, that after a given step, the input signal voltage is determined to be in. In other words, the input signal voltage may be determined to be between V1 and V2=V1+DV, where, for example, V1=(32/64)*Vref and V2=(48/64)*Vref. However, if one or more of the prior decisions made about one or more intermediate values of the output code were wrong, the input signal voltage may be slightly below V1. In a conventional approach after each step, the voltage interval DV is further divided by 4 by cutting the number of voltage interval in three places, and thus comparing the input voltage signal with three comparison levels V1+1*DV/4, V1+2*DV/4, and V1+3*DV/4. According to the decision results, the interval to explore will be either [V1, V1+1*DV/4[, [V1+1*DV/4, V1+2*DV/4[, [V1+2*DV/4, V1+3*DV/4[, or [V1+3*DV/4, V2[. Thus the next interval that will be explored will always be included into the current one. In this approach there is no room to correct for any wrong decision made in the earlier steps. In this example, the number of error-signal division intervals is 4 as there are 4 voltage intervals.

FIG. 9 is a diagram illustrating an example of an improved voltage-interval division scheme allowing tolerance to decision errors, in accordance with certain configurations of the present disclosure. In order to allow correction of previous wrong decisions, the voltage interval DV in FIG. 9 is divided into four sections by cutting the voltage interval DV in four places, therefore allowing comparing the input voltage signal with four levels instead of three levels, as discussed above with respect to FIG. 8. The four equally spaced levels in the current interval [V1, V2[ correspond to levels V1+DV/8, V1+3*DV/8, V1+5*DV/8 and V1+7*DV/8, as shown in FIG. 9. The signal voltage level is then determined to be in a smaller interval of width DV/4, after taking into account the results from the comparator. For instance, if the signal is larger than V1+DV/8 and smaller than V1+3/8*DV, it is determined to be in the equivalent interval of width DV/4 which will then be explored during the next SA steps. Now, if the comparisons indicate that the signal is smaller than V1+DV/8, the input signal voltage is theoretically expected to be in the interval [V1, V1+DV/8[, of width DV/8 instead of DV/4. Therefore, one more bit is obtained in advance for this case. The same situation occurs if V1>V1+7/8*DV. In this case the signal is theoretically expected to be in the interval [V1+7/8*DV, V2[=[V2−DV/8, V2[ of width DV/8 instead of DV/4. However, it may not be useful to have a number of SA steps depending on the signal. Further, it may be beneficial to correct any errors due to prior wrong decisions. Therefore, if it is determined that Vin<V1+dV/8, the next interval to explore will be the interval [V1−DV/8, V1+DV/8[, of width DV/4, instead of the interval [V1, V1+DV/8[, of width DV/8. Using the improved division scheme of FIG. 9, if the signal is in the interval between [V1−DV/8, V1[, but was first determined to be above V1 due to a wrong comparison in a previous step, such wrong decision can be compensated for in the next step. A similar correction is also possible if the signal is in the interval [V2, V2+DV/8[, but was previously found to be smaller than V2. Thus by using more comparisons, some redundancy is added, making the ADC circuit to some extent tolerant to some decision errors.

To illustrate how the above improved division scheme works, consider a scenario where the input signal voltage is 161.2/256*Vref=40.3/64*Vref. At the first step (i.e., where V1=0), the input signal voltage (e.g. Vin of FIG. 7) is compared with four reference voltages equal to 1/8*Vref, 3/8*Vref, 5/8*Vref, and 7/8*Vref by applying codes 1/8*64=8, 3/8*64=24, 5/8*64=40, 7/8*64=56 to the four different sub-DACs 710 of FIG. 7. The corresponding reference voltages to which the input signal voltage is compared are 8/64*Vref, 24/64*Vref, 40/64*Vref, and 56/64*Vref. As the input signal voltage is 40.3/64*Vref, theoretically, the input signal voltage, after the first step, is expected to be found to be in the interval between 40/64*Vref and 56/64*Vref. However, as the input voltage signal is close to the threshold of 40/64*Vref, this decision may be made wrongly due to some offset or settling errors. If the corresponding comparator indicates Vin<40/64*Vref, then the next voltage interval to be explored is thus erroneously decided to be [24/64*Vref, 40/64*Vref[, which does not include the input signal voltage level (i.e., 40.3/64*Vref). The next four comparison levels are then equally spaced in this interval and correspond to codes 24+1/8*16=26, 24+3/8*16=30, 24+5/8*16=34, and 24+7/8*16=38, with corresponding comparison levels at 26/64*Vref, 30/64*Vref, 34/64*Vref, and 38/64*Vref. As the signal is 40.3/64*Vref, if there is no more decision error at this time, the signal is found to be larger than 38/64*Vref, and thus the next interval to be explored is the interval [38/64*Vref, 42/64*Vref[, which now includes the input signal, indicating that the wrong decision at the first step is compensated for at a following step.

Continuing with further comparison steps, the next interval to explore is thus the interval [38/64*Vref, 42/64*Vref[, which is divided by 4 by selecting four comparison levels. However, it is not possible to select the next thresholds as before, namely, 38/64+1/8*4/64*Vref (i.e., 38.5/64*Vref), 38/64+3/8*4/64*Vref (i.e., 39.5/64*Vref), 38/64+5/8*4/64*Vref (i.e., 40.5/64*Vref), and 38/64+7/8*4/64*Vref (i.e., 41.5/64*Vref), as it would require 7-bit sub-DACs formed with each 128 elementary capacitors, instead of 6-bit DACs 710 of FIG. 7. Nevertheless, to select four reference levels spaced by Vref/64 in order to refine the interval [38/64*Vref, 42/64*Vreg[, The four selection levels may include 38/64*Vref, 39/64*Vref, 40/64*Vref, and 41/64*Vref or 39/64*Vref, 40/64*Vref, 41/64*Vref, and 42/64*Vref. As the code 38/64*Vref has already been exercised at the previous step, the four comparisons are made with respect to voltages 39/64*Vref, 40/64*Vref, 41/64*Vref, and 42/64*Vref, by applying codes 39, 40, 41 and 42 and all four sub-DACs (e.g., sub-DACs 710). The signal is then determined to be in the interval between 40/64*Vref=160/256*Vref and 41/64*Vref=164/256*Vref.

At the final step, the four sub-DACs are merged together and the code 40+40+41+41=162 is exercised by applying code 40 to two sub-DACs and code 41 to the other two sub-DACs. As the input voltage is 161.2/256*Vref, the corresponding bit from the comparator is low. The interval is then limited to [160/256*Vref,162/256*Vref[, so the final bit is obtained by comparing the input signal voltage with a reference level of 161/256*Vref, by applying code 40 to three of the sub-DACs and code 41 to the last sub-DAC. As the input signal voltage is higher than 161/256*Vref, the corresponding bit from the comparator is high and the input voltage will be determined to be in the interval [161/256*Vref, 162/256*Vref[. Therefore, code 161 will be provided as the output code 742 of the SAR 740 of FIG. 7. The code 161 corresponds to the expected value, in spite of the error that occurred in the first SA step and was later compensated for in the following steps. The above case represents a simple example of application of redundancy achievable by splitting the capacitive DAC array into several sub-DACs. Other possibilities may also exist, depending on the total number of bits to be extracted per SA ADC, the number of sub-DACs, which the capacitive DAC is sub-divided into, and so on. For example, a technique similar to the 1.5 bit per cycle or redundant signed digit (RSD) (where the designer can pad in 0.5 bit for redundancy to compensate for error) can be derived by using two comparisons per cycle, instead of one, in order to extract a single bit per cycle with a good redundancy and hence making the ADC circuit (e.g., ADC circuit 700 of FIG. 7) largely tolerant to decision errors in the first one or more steps of the SA phase. In the example shown in FIG. 9, the number of error-signal division intervals is 5 as there are 5 voltage intervals.

Multi-bit Quantization Using Flash ADC

In one aspect, an alternative method of splitting the DAC into several sub-DACs and merging the sub-DACs at the end of the SA phase to extract the last bits, is to use a single redistribution DAC but with a multi-bit flash ADC. The multi-bit flash can quantify more finely the error voltage at a given step, thus extracting more than one bit at time, as described with respect to FIG. 10 below.

Figure 10:
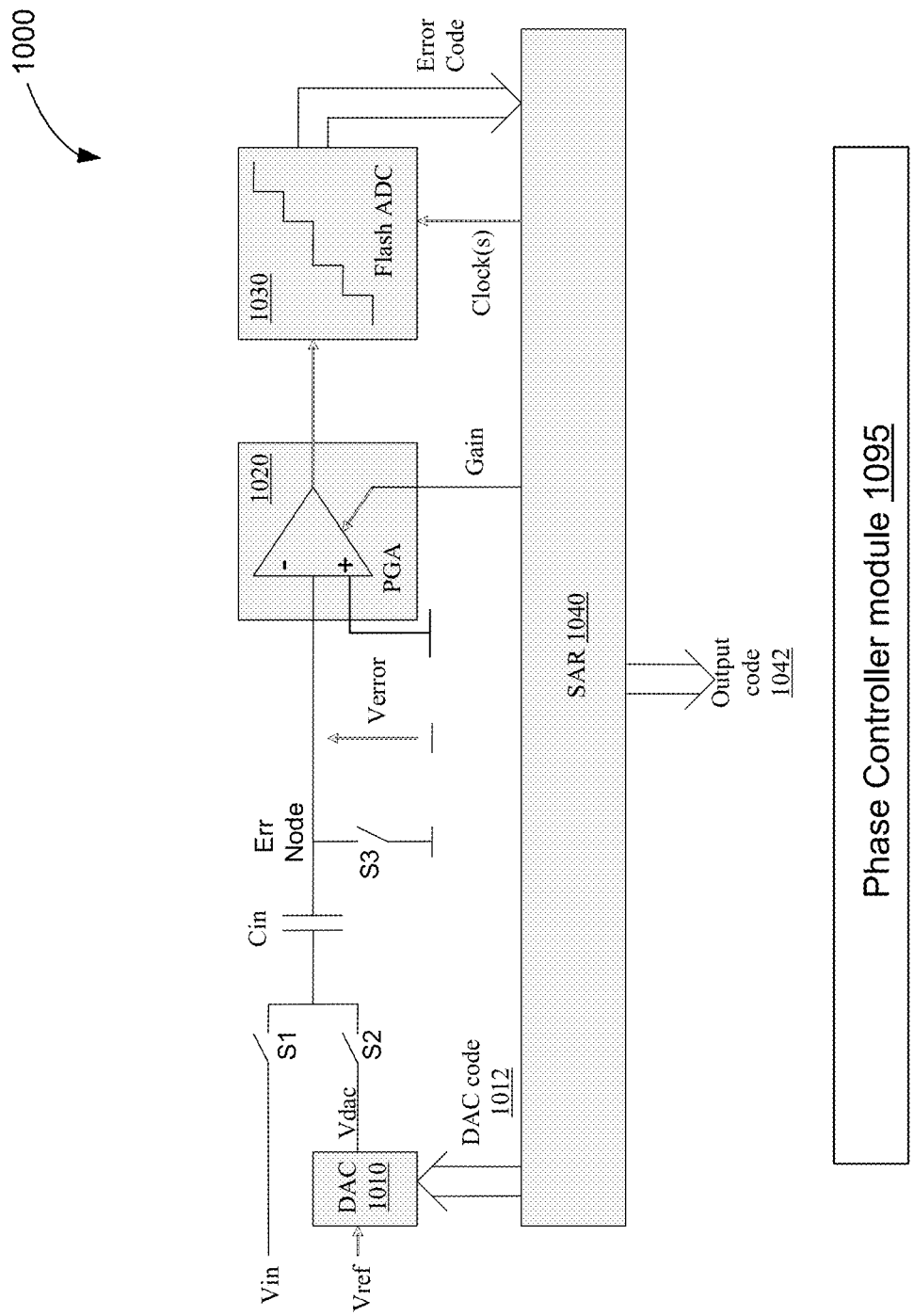
FIG. 10 is a block diagram of an example of a multi-bit SA ADC using a flash ADC.

FIG. 10 is a block diagram of an example of a multi-bit SA ADC circuit 1000 using a flash ADC, in accordance with certain configurations of the present disclosure. Multi-bit SA ADC 1000 (hereinafter "ADC 1000") may include a DAC 1010, switches S1, S2, and S3, input capacitor Cin, PGA 1020, flash ADC 1030, and SAR 1040. The flash ADC is used to quantify an error (Vdac−Vin) on the current estimation of an input signal voltage Vin, in order to refine this estimation for the next step. The error in the current estimation may be larger at the beginning of the SA phase, and become smaller for subsequent SA phases. Hence, in operation, a large input swing may be applied to the flash ADC 1030 at the beginning of the SA phase and the swing may become smaller and smaller with the progression of the SA phase. One way to alleviate this problem is by introducing the PGA 1020 before flash ADC 1030.

According to one aspect, the ADC 1000 may comprise an 8-bit ADC using an 8-bit DAC array (e.g., DAC 1010) to generate a level between 0 and Vref. The DAC 1010 may be realized, for example, by charge redistribution within the capacitive array, or externally by a resistive divider to provide a selection of an appropriate voltage level. Consider a scenario where the input signal voltage is 161.2/256*Vref, as in the example discussed above with respect to ADC 700 of FIG. 7. At the beginning of the operation, during phase 1 of pre-charge, the input capacitor Cin (e.g., a capacitor array) is precharged to the input signal voltage Vin applied to a left electrode of capacitor Cin, while the right electrode (e.g., err node in FIG. 10) is tied to a well defined voltage source, for example, a ground potential, via switch S3.

At the start of the SA phase (i.e., the first SAR cycle), the input capacitor Cin is disconnected from the voltage source (e.g., ground potential) via switch S3, thus, forced into a high impedance state. The left electrode of the input capacitor Cin is coupled through S2 to Vdac (i.e., output signal of DAC 1010), while a predetermined DAC code 1012 is applied, via SAR 1040, to an input port of DAC 1010. If, for instance, DAC code 1012 is initially set to zero by SAR, a DAC output voltage Vdac of 0/256*Vref=0 appears at the output port of DAC 1010. In this case, the error voltage Verr applied on the right electrode of the input capacitor Cin is equal to Vdac−Vin=0−Vin=−Vin, so the input range of the PGA is between −Vref and 0. The PGA 1020 is in an inverting configuration, thus having a negative gain. If the programmable gain of PGA 1020 is set to −1 in this phase (e.g., by a control module of SAR 1040, not shown in FIG. 10, for simplicity), the input range of the flash is between 0 and Vin,max=Vref. In order to extract two bits per cycle, without redundancy, this range is divided by 3 by setting comparison threshold levels of flash ADC 1020 to 1/4*Vref (i.e., 64/256*Vref), 2/4*Vref (i.e., 128/256*Vref), and 3/4*Vref (i.e., 192/256*Vref). As the input signal voltage is 161.2/256*Vref, thus between 128/256*Vref and 192/256*Vref, the interval to explore for the output code is [128, 192[, the two MSBs are determined to be '10,' and next DAC code 1012 applied to the DAC is 128, corresponding to binary word '10000000'.

The error voltage, Verror, during the next SAR cycle is 128/256*Vref−Vin, and thus, between 0−Vref/4 and 0. As the input range of the flash ADC is between 0 and Vref, the next gain of PGA 1020 is set to a value of −4 (corresponding to the 2 bits previously extracted) in order to fully extract the input range. As the input voltage is 161.2/256*Vref, the resulting error voltage, −Verror, is (128−161.2)/256*Vref=−33.2/256*Vref, which, multiplied by the programmable gain of −4, gives an input voltage of 132.8/256*Vref for the flash ADC 1030, thus a value between 128/256*Vref and 192/256*Vref. Therefore, the two next bits are determined to be '10'.

At the third SAR cycle, the DAC code 1012 applied to the DAC 1010 is set by SAR 1040 to '1010 0000,' corresponding to the four obtained bits filled in with 0's on the right, which corresponds to a decimal value 160. The error voltage during third SAR cycle is then (160−161.2)/256*Vref=−1.2/256*Vref. The range of the error at this cycle is, therefore, between −Vref/16 and 0, so it is amplified by a PGA 1020 gain of −16 at the third SAR cycle, in order to compensate for the four already obtained bits. The input voltage of the flash ADC 1030 is thus 16*1.2/256*Vref=19.2/256*Vref, which is in the interval between 0 and Vref/4, so the next 2 bits are determined to be '00'.

At the fourth SAR cycle, the DAC code 1012 applied on the DAC 1010 is '101000 00', corresponding to the 6 obtained bits with two supplementary 0's at the end. In this particular case it is in fact the same code as at the previous cycle (1.2/256*Vref), because the bits determined at the previous step were '00'. However, as 6 bits have already been processed, the range of this error is between −Vref/64 and 0, so it is multiplied by −64 in order to match the input range of the flash ADC 1030. The input voltage of the flash ADC 1030 will then be 64*1.2/256*Vref=76.8/256*Vref. As this voltage is between Vref/4 and 2*Vref/4, the two last bits are determined to be '01', leading to the output code 1042 of 10100001, corresponding to code 161, the value that was expected to be found. In the technique discussed above, the 8 bits have been obtained in 4 SA steps, as two bits are determined at each SA step. The principle of the above-described technique can be generalized to encompass various ADCs with different number of comparators and bits of the flash ADC.

Multi-Bit Quantization Using Flash ADC with Programmable Gain and Redundancy

In the description of ADC 1000 of FIG. 10, only a minimum number of comparisons (3 for 2 bits per cycle) is implemented, with no provision for compensation of errors due to offset voltage of the comparators (internal to flash ADC 1030 of FIG. 10), the values of the threshold voltages, or on the gains performed on PGA 1020 of FIG. 10. However, here again, some redundancy can be added into the process by increasing the number of comparison levels, as described with respect to FIG. 9. For instance, by using a flash ADC with four comparison levels instead of three, two bits per cycle can be extracted with redundancy. For instance by using four comparison levels or threshold instead of three, these levels could be placed at 1/8*Vref, 3/8*Vref, 5/8*Vref and 7/8*Vref, so that five resulting intervals (as shown in FIG. 9) instead of four intervals (as shown in FIG. 9) can be determined, allowing to correct some errors in first SAR steps. These supplementary decision levels may permit to avoid divergence of the error at the input of the flash ADC while increasing the programmed gain.

Additional Description Regarding Multi-bit Quantization Using Flash ADC

In one aspect, an ADC circuit 1000 in FIG. 10 may include a phase controller module 1095 to control at least some of the components shown in FIG. 10 such as switches S1, S2, and S3, PGA 1020, flash ADC 1030, and SAR 1040 ("controlled components C") to allow the controlled components C to perform, among others, some or all of the functions described above. While the controlling connections are not explicitly shown in FIG. 10 simply not to complicate the drawing, such connections exist between 1095 and each of the controlled components C (in a manner similar to FIG. 4), and these connections are considered to be depicted. In one advantageous example, flash ADC 1030 may be replaced by any ADC.

Further Description of Subject Disclosure

An aspect of the disclosure (e.g., FIG. 7) provides decomposing a capacitive DAC array into several sub-DACs, each sub-DAC being exercised with different codes during the first successive approximation steps in order to accelerate the successive approximation phase and to reduce the number of required steps, while for the last one or more steps, the different sub-DACs (e.g., all of the sub-DACs) are merged together in order to obtain the least significant bits.

An aspect of the disclosure (e.g., FIG. 10) provides an SAR with a multi-bit flash ADC (instead of comparators) and a programmable gain amplifier (PGA) circuit in front of the flash ADC, in order to determine more than one bit at a time.

In one aspect, the use of additional comparators (or the use of additional comparisons) can achieve tolerance to some decision errors (due to thresholds, offset, settling, gain error, etc.). These additional comparators (or additional comparisons) can be utilized in a successive approximation ADC such as the ADC circuits shown in FIGS. 7 and 10.

Broadly and generally, in one aspect, the disclosure provides an n-bit analog-to-digital converter (ADC) circuit to convert an analog input signal to a digital output signal in a number of successive approximation (SA) cycles. The n-bit ADC circuit may comprise one or more of the following: a digital-to-analog converter (DAC) circuit including one or more capacitive sub-DAC circuits, a number of switches, one or more comparators, and an SA register (SAR) circuit. The n-bit DAC circuit may include a corresponding number of capacitive elements, each configured to be pre-charged to the analog input signal to obtain an error signal. The corresponding number of capacitive elements may be grouped into a number of capacitive sub-DAC circuits. Each of the comparators may be coupled to one of the capacitive sub-DAC circuits. The switches may be configured to isolate the capacitive sub-DAC circuits during one or more first cycles of the SA cycles and to merge the capacitive sub-DAC circuits during one or more last cycles of the SA cycles. The SAR circuit may be configured to receive an output signal from each of the plurality of comparators and to generate the digital output signal or a number of DAC digital signals. In one aspect, the number of comparators represents a positive integer greater than one. In one aspect, the number n of the n-bit ADC represents a positive integer. The SA cycles may include a first portion and a second portion, where the first portion may include the one or more first cycles, and the a second portion may include the one or more last cycles, where the first portion precedes the second portion. In one aspect, the SA cycles may consist of the one or more first cycles and the one or more last cycles. In one aspect, the one or more first cycles include multiple cycles.

Broadly and generally, in one aspect, the present disclosure provides an n-bit ADC circuit to convert an analog input signal to a digital output signal in a number of SA cycles. The n-bit ADC may comprise one or more of the following: a DAC circuit, an input capacitor, a programmable gain amplifier (PGA) circuit, a multi-bit flash ADC circuit, and an SAR circuit. The DAC circuit may be configured to generate a DAC analog signal by converting a DAC digital signal to the DAC analog signal. The input capacitor may be configured to be pre-charged to one or more of the analog input signals or the DAC analog signal. The PGA circuit may be configured to amplify an error signal including a difference between the analog input signal and the DAC analog signal. The gain configuration of PGA circuit may be changed during some of the SA cycles. The multi-bit flash ADC circuit may be configured to convert the amplified error signal to a multi-bit digital signal. The SAR circuit may be configured to use the multi-bit digital signal to generate, in some of the SA cycles, one or more DAC digital signals or the digital output signal.

In one example, the term successive approximation cycles can refer to cycles that are successive (or sequential) and that can provide a value(s) that are approximate. In another example, the term successive approximation cycles can refer to cycles that are successive (or sequential) and that are iterative. In one example, the term successive approximation register may refer to a register that produces a final value(s) based on successively computing approximate values. In one example, the term successive approximation may refer to producing a final value(s) based on successively computing approximate values. In one example, in a successive approximation cycle, a search range is first divided into a top half and a bottom half Then a result of a comparison determines whether the next step of the search is in the top or the bottom half Next, based on the determination, the top half or the bottom half is divided into another top and bottom half and the process continues until the final result it found. . In one example, in a successive approximation method, the initial approximations are coarse and get finer and finer as the successive approximation cycles progress, until a final code is reached, as described in detail above. These are examples, and these terms are not limited to these examples.

Illustrations of Subject Disclosure using Clauses

Various examples of aspects of the disclosure are described as numbered clauses (1, 2, 3, etc.) for convenience. These are provided as examples, and do not limit the subject technology. Identifications of the figures and reference numbers are provided below merely as examples and illustrative purposes, and the clauses are not limited by those identifications.

1. An n-bit analog-to-digital converter (ADC) circuit (e.g., 700 in FIG. 7) for converting an analog input signal to a digital output signal by processing more than one bit per cycle in a number of successive approximation cycles, the n-bit ADC circuit comprising:

an n-bit digital-to-analog (DAC) circuit (e.g., some or all of 710's of FIG. 7) including a corresponding number of capacitive elements, each of the capacitive elements configured to be pre-charged to the analog input signal to obtain an error signal, the corresponding number of capacitive elements grouped into a number of capacitive sub-DAC circuits (e.g., 710 of FIG. 7);

a plurality of comparators (e.g., some or all of 730's of FIG. 7), each of the plurality of comparators coupled to one of the capacitive sub-DAC circuits;

a plurality of first switches (e.g., SM11, SM21, and SM31 of FIG. 7) configured to isolate the capacitive sub-DAC circuits during one or more first cycles of the successive approximation cycles, and to merge the capacitive sub-DAC circuits during one or more last cycles of the successive approximation cycles; and a successive approximation register (SAR) circuit (e.g., 740 of FIG. 7) configured to receive an output signal from the plurality of comparators and to generate at least one of the digital output signal and a number of DAC digital signals (e.g., Code-dac1(5:0), Code_dac2, as described with reference to FIG. 7 above), wherein n represents a positive integer greater than one.

2. The n-bit ADC circuit of clause 1, wherein the error signal comprises a difference between the analog input signal and a reference signal.

3. The n-bit ADC circuit of clause 1, wherein the corresponding number of capacitive elements substantially equals to $2^n$.

4. The n-bit ADC circuit of clause 1, further comprising a plurality of second switches (e.g., SM12, SM22, and SM32 of FIG. 7), each of the plurality of second switches configurable to interconnect two adjacent ones of the plurality of comparators.

5. The n-bit ADC circuit of clause 1, further comprising an amplifier circuit (e.g., 720 of FIG. 7) coupled between an output of each of the capacitive sub-DAC circuits and an input of a corresponding one of the plurality of comparators, wherein each of the capacitive sub-DAC circuits is configured to receive one of the DAC digital signals (e.g., Code-dac1(5: 0), Code_dac2, as described with reference to FIG. 7 above), and wherein a number of bits of each of the capacitive sub-DAC circuits is less than a number of bits of the digital output signal.

6. The n-bit ADC circuit of clause 5, further comprising a plurality of shunt switches (e.g., some or all of 725's in FIG. 7), each of the plurality of shunt switches configured to be closed to short out an input and an output of a corresponding one of the amplifier circuits when a corresponding one or more of the capacitive elements is pre-charged, each of the plurality of shunt switches configured to be open to disconnect from each other the input and the output of the corresponding one of the amplifier circuits when the input of the corresponding one of the amplifier circuits is ready for comparison.

7. The n-bit ADC circuit of clause 1, wherein the SAR circuit is configured to compute more than one bit per successive approximation cycle, during cycles prior to the one or more last cycles.

8. The n-bit ADC circuit of clause 1, wherein n is 8, and each of the capacitive sub-DAC circuits comprises a 6-bit DAC (e.g., 710 in FIG. 7), and wherein the one or more last cycles comprise the last two cycles of the successive approximation cycles.

9. The n-bit ADC circuit of clause 1, wherein the n-bit ADC circuit is configured to compute the digital output signal in less than eight cycles, wherein the n-bit ADC circuit is configured to compute, during each of the first three cycles of the successive approximation cycles, two bits of the digital output signal, and wherein n is 8.

10. The n-bit ADC circuit of clause 1, wherein each of the plurality of comparators is configured to perform a number of comparisons, and wherein one or more of the plurality of comparators are configured to perform one or more comparisons in addition to the number of comparisons to allow the n-bit ADC circuit to be tolerant to decision errors including a decision error associated with at least one of a threshold level, an offset voltage, a settling time, and a gain value. (e.g., FIG. 9)

11. An n-bit analog-to-digital converter (ADC) circuit (e.g., 1000 of FIG. 10) for converting an analog input signal to a digital output signal by processing more than one bit per cycle in a number of successive approximation cycles, the n-bit ADC circuit comprising:
   a digital-to-analog converter (DAC) circuit (e.g., 1010 of FIG. 10) configured to generate a DAC analog signal by converting a DAC digital signal to the DAC analog signal;
   an input capacitor (e.g., Cin of FIG. 10) configured to be pre-charged to at least one of the analog input signal and the DAC analog signal;
   a programmable gain amplifier (PGA) circuit (e.g., 1020 of FIG. 10) configured to amplify an error signal including a difference between the analog input signal and the DAC analog signal, wherein the PGA circuit is configured to change a gain of the PGA circuit during at least some of the successive approximation cycles;
   a multi-bit flash ADC circuit (e.g., 1030 of FIG. 10) configured to convert the amplified error signal to a multi-bit digital signal; and
   a successive approximation register (SAR) circuit (e.g., 1040 of FIG. 10) configured to use the multi-bit digital signal to generate, in at least some of the successive approximation cycles, at least one of a DAC digital signal and the digital output signal,
   wherein n represents a positive integer greater than one.

12. The n-bit ADC circuit of clause 11, wherein the DAC circuit comprises a single charge redistribution capacitive DAC.

13. The n-bit ADC circuit of clause 11, further comprising a plurality of switches configured to provide the error signal at an input port of the PGA circuit.

14. The n-bit ADC circuit of clause 11, further comprising a control circuit configured to provide a control signal to the PGA circuit, and wherein the PGA circuit is further configured to change the gain of the PGA circuit in response to the control signal.

15. The n-bit ADC circuit of clause 11, wherein the SAR circuit is configured to compute more than one bit per successive approximation cycle.

16. The n-bit ADC circuit of clause 11, wherein the multi-bit flash ADC circuit is configured to convert the amplified error signal by performing a number of comparisons, and wherein the multi-bit flash ADC circuit is further configured to allow the n-bit ADC circuit to be tolerant to decision errors including a decision error associated with at least one of a threshold level, an offset voltage, a settling time and a gain value, by performing one or more comparisons in addition to the number of comparisons.

Figures 11, 12:
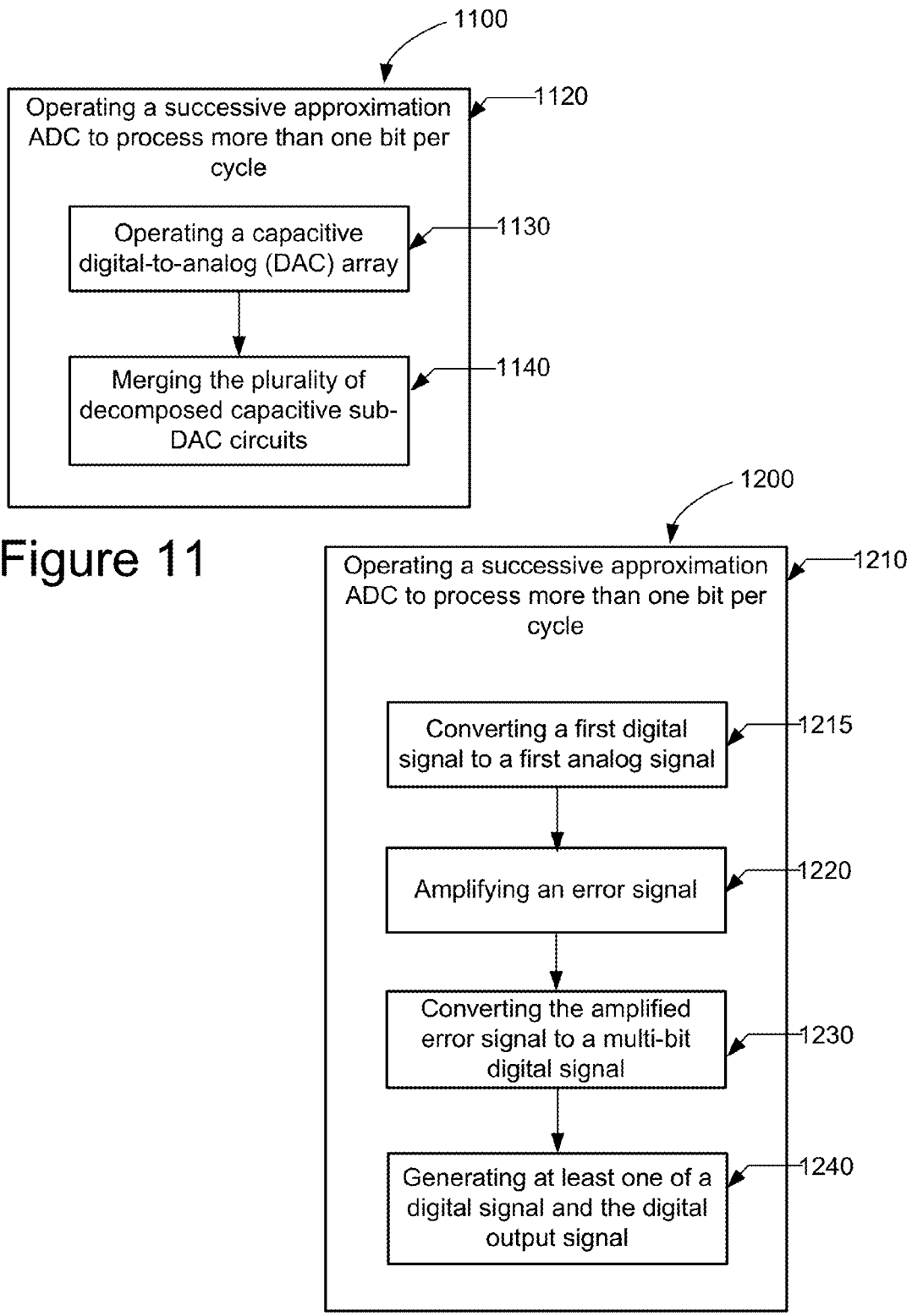
FIG. 11 is a flow diagram of an example of a method for operating an SA ADC.
FIG. 12 is a flow diagram of another example method for operating an SA ADC.

17. A method (e.g., 1100 in FIG. 11) of converting an analog input signal to a digital output signal, comprising:
   operating a successive approximation analog-to-digital converter (ADC) circuit to process more than one bit per cycle, the cycle being a successive approximation cycle, the operating (e.g., 1120 of FIG. 11) comprising:
      operating a capacitive digital-to-analog (DAC) array of the ADC circuit as a plurality of decomposed capacitive sub-DAC circuits during one or more first cycles (e.g., 1130 of FIG. 11); and
      merging the plurality of decomposed capacitive sub-DAC circuits of the capacitive DAC array during one or more last cycles (e.g., 1140 of FIG. 11).

18. The method of clause 17, wherein the operating the successive approximation ADC circuit comprises performing a number of comparisons to reduce decision errors, wherein the number of comparisons is greater than a minimum number of comparisons, wherein the minimum number of comparisons is $(2^p)-1$, wherein p is the number of bits utilized per cycle, wherein p is an integer number greater than 1.

19. The method of clause 18, wherein the operating the successive approximation ADC circuit comprises producing an error signal that comprises a difference between the analog input signal and a signal computed in connection with one cycle and utilizing the error signal in at least one of the comparisons,
   wherein the minimum number of comparisons is associated with a first number of error-signal division intervals, wherein the number of comparisons is associated with a second number of error-signal division intervals, wherein the second number of error-signal division intervals is greater than the first number of error-signal division intervals.

20. A method (e.g., 1200 of FIG. 12) of converting an analog input signal to a digital output signal, comprising:
   operating a successive approximation analog-to-digital converter (ADC) circuit to process more than one bit per cycle, the cycle being a successive approximation cycle, the operating (e.g., 1210 of FIG. 12) comprising:
      converting a first digital signal to a first analog signal (e.g., 1215 of FIG. 12);
      amplifying an error signal, the error signal comprising a difference between the analog input signal and the first analog signal (e.g., 1220 of FIG. 12);
      converting the amplified error signal to a multi-bit digital signal (e.g., 1230 of FIG. 12); and
      generating, in at least some of the cycles, at least one of a digital signal and the digital output signal based on the multi-bit digital signal (e.g., 1240 of FIG. 12),
   wherein a gain associated with the amplifying is increased during at least some of the cycles.

21. The method of clause 20, wherein the converting the amplified error signal to the multi-bit digital signal comprises performing a number of comparisons, and wherein the converting the amplified error signal to the multi-bit digital signal comprises performing an additional number of comparisons to reduce decision errors.

22. An analog-to-digital converter (ADC) circuit for converting an analog input signal to a digital output signal in a number of cycles, the ADC circuit comprising:
   a digital-to-analog (DAC) circuit including a corresponding number of capacitive elements, the capacitive elements configured to be pre-charged, the corresponding number of capacitive elements grouped into a number of capacitive sub-DAC circuits;
   a plurality of comparators coupled to the capacitive sub-DAC circuits;
   a plurality of first switches configured to merge the capacitive sub-DAC circuits during a last portion of the cycles; and
   a processing circuit configured to receive an output signal from at least some of the comparators and to generate at least one of a digital output signal and one or more digital signals.

23. An analog-to-digital converter (ADC) circuit for converting an analog input signal to a digital output signal in a number of cycles, the ADC circuit comprising:
   a digital-to-analog converter (DAC) circuit configured to convert a DAC digital signal to a DAC analog signal;
   a capacitor configured to be pre-charged to at least one of the analog input signal and the DAC analog signal;
   an amplifier circuit configured to amplify an error signal;

a multi-bit ADC circuit configured to convert the amplified error signal to a multi-bit digital signal; and a processing circuit configured to use the multi-bit digital signal to generate at least one of a DAC digital signal and the digital output signal.

Various examples of aspects of the disclosure are described as numbered clauses (1, 2, 3, etc.) for convenience. These are provided as examples, and do not limit the subject technology. Identifications of the figures and reference numbers are provided below merely as examples and for illustrative purposes, and the clauses are not limited by those identifications.

Figure 13:
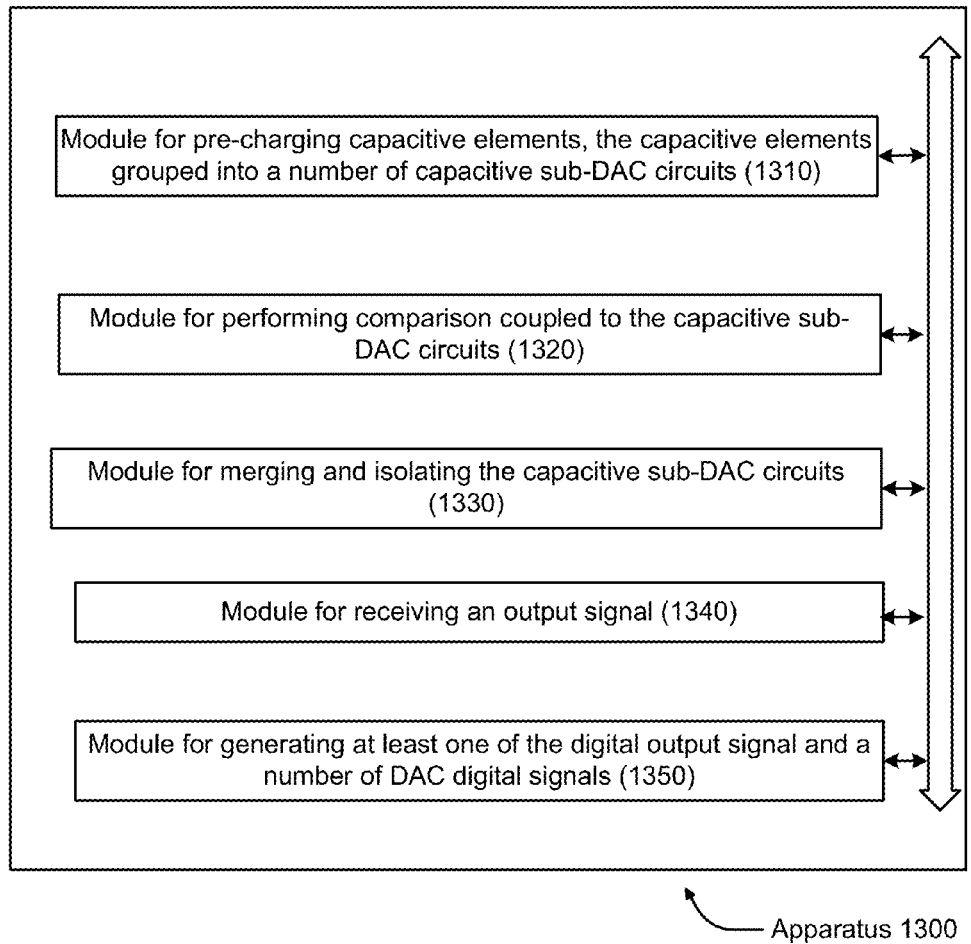
FIGS. 13, 14, 15A, 15B, 16A, 16B, 17 and 18 are block diagrams of examples of an apparatus for performing SA analog-to-digital conversions.

1. An n-bit analog-to-digital converter (ADC) circuit (e.g., 1300 in FIG. 13) for converting an analog input signal to a digital output signal in a number of successive approximation cycles, the n-bit ADC circuit comprising:

means for pre-charging capacitive elements, the capacitive elements grouped into a number of capacitive sub-DAC circuits (e.g., 1310 in FIG. 13);

means for performing comparison coupled to the capacitive sub-DAC circuits (e.g., 1320 in FIG. 13);

means for isolating the capacitive sub-DAC circuits during one or more first cycles of the successive approximation cycles and merging the capacitive sub-DAC circuits during one or more last cycles of the successive approximation cycles (e.g., 1330 in FIG. 13);

means for receiving an output signal from the plurality of comparators (e.g., 1340 in FIG. 13); and means for generating at least one of the digital output signal and a number of DAC digital signals (e.g., 1350 in FIG. 13), wherein n represents a positive integer greater than one.

2. The n-bit ADC circuit of clause 1, wherein the error signal comprises a difference between the analog input signal and a reference signal.

3. The n-bit ADC circuit of clause 1, wherein the capacitive elements substantially comprise $2^n$ elements.

4. The n-bit ADC circuit of clause 1, wherein the means for performing comparison comprises a plurality of comparators, and wherein the n-bit ADC circuit comprises means for interconnecting two adjacent ones of the plurality of comparators.

5. The n-bit ADC circuit of clause 1, further comprising means for performing amplification coupled between the means for pre-charging and the means for performing comparison, wherein each of the capacitive sub-DAC circuits is configured to receive one of the DAC digital signals, and wherein a number of bits of each of the capacitive sub-DAC circuits is less than a number of bits of the digital output signal.

6. The n-bit ADC circuit of clause 5, wherein the means for performing amplification comprises amplifier circuits, wherein the n-bit ADC circuit comprises means for shunting, and wherein the means for shunting is configured to short out an input and an output of a corresponding one of the amplifier circuits when a corresponding one or more of the capacitive elements is pre-charged and configured to open to disconnect from each other the input and the output of the corresponding one of the amplifier circuits when the input of the corresponding one of the amplifier circuits is ready for comparison.

7. The n-bit ADC circuit of clause 1, wherein the means for generating is configured to compute more than one bit per successive approximation cycle, during cycles prior to the one or more last cycles.

8. The n-bit ADC circuit of clause 1, wherein n is 8, and each of the capacitive sub-DAC circuits comprises a 6-bit DAC, and wherein the one or more last cycles comprise the last two cycles of the successive approximation cycles.

9. The n-bit ADC circuit of clause 1, wherein the n-bit ADC circuit is configured to compute the digital output signal in less than eight cycles, wherein the n-bit ADC circuit is configured to compute, during each of the first three cycles of the successive approximation cycles, two bits of the digital output signal, and wherein n is 8.

10. The n-bit ADC circuit of clause 1, wherein the means for performing comparison comprises a plurality of comparators, wherein each of the plurality of comparators is configured to perform a number of comparisons, and wherein one or more of the plurality of comparators are configured to perform one or more comparisons in addition to the number of comparisons to allow the n-bit ADC circuit to be tolerant to decision errors including a decision error associated with at least one of a threshold level, an offset voltage, a settling time, and a gain value.

Figure 14:
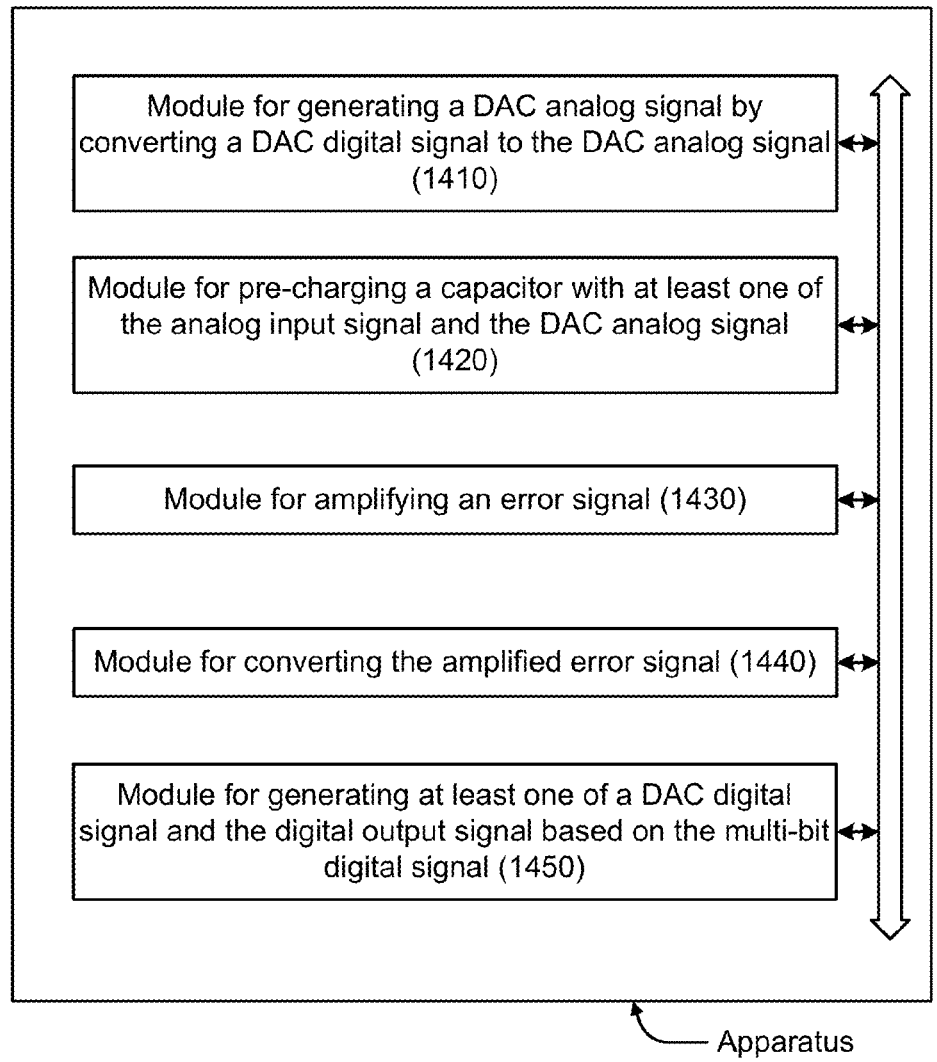

11. An n-bit analog-to-digital converter (ADC) circuit for converting an analog input signal to a digital output signal in a number of successive approximation cycles, the n-bit ADC circuit comprising:

means for generating a DAC analog signal by converting a DAC digital signal to the DAC analog signal (e.g., 1410 in FIG. 14);

means for pre-charging a capacitor with at least one of the analog input signal and the DAC analog signal (e.g., 1420 in FIG. 14);

means for amplifying an error signal including a difference between the analog input signal and the DAC analog signal, wherein the means for amplifying is configured to change a gain of the means for amplifying during at least some of the successive approximation cycles (e.g., 1430 in FIG. 14);

means for converting the amplified error signal to a multi-bit digital signal (e.g., 1440 in FIG. 14); and means for generating, in at least some of the successive approximation cycles, at least one of a DAC digital signal and the digital output signal based on the multi-bit digital signal (e.g., 1450 in FIG. 14), wherein n represents a positive integer greater than one.

12. The n-bit ADC circuit of clause 11, wherein the means for generating a DAC analog signal comprises a single charge redistribution capacitive DAC.

13. The n-bit ADC circuit of clause 11, further comprising means for switching, the means for switching configured to provide the error signal at an input port of the means for amplifying.

14. The n-bit ADC circuit of clause 11, further comprising means for controlling, the means for controlling configured to provide a control signal to the means for amplifying, and wherein the means for amplifying is further configured to change the gain of the means for amplifying in response to the control signal.

15. The n-bit ADC circuit of clause 11, wherein the means for generating at least one of a DAC digital signal and the digital output signal is configured to compute more than one bit per successive approximation cycle.

16. The n-bit ADC circuit of clause 11, wherein the means for converting the amplified error signal is configured to convert the amplified error signal by performing a number of comparisons, and wherein the means for converting the amplified error signal is further configured to allow the n-bit ADC circuit to be tolerant to decision errors including a decision error associated with at least one of a threshold level, an offset voltage, a settling time and a gain value, by performing one or more comparisons in addition to the number of comparisons.

Figure 15A:
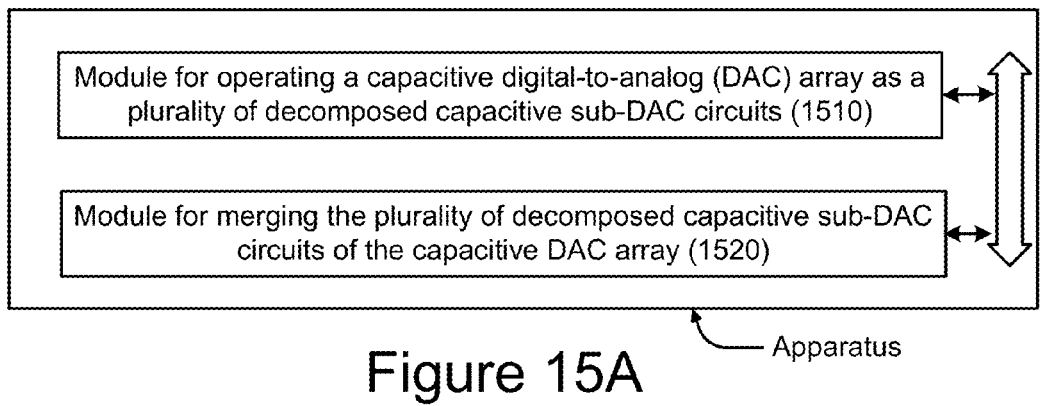

17. An apparatus for converting an analog input signal to a digital output signal in a number of successive approximation cycles, comprising:

means for operating a capacitive digital-to-analog (DAC) array as a plurality of decomposed capacitive sub-DAC circuits, during one or more first cycles of the successive approximation cycles (e.g., 1510 in FIG. 15A); and means for merging the plurality of decomposed capacitive sub-DAC circuits of the capacitive DAC array, during one or more last cycles of the successive approximation cycles (e.g., 1520 in FIG. 15A).

Figure 15B:
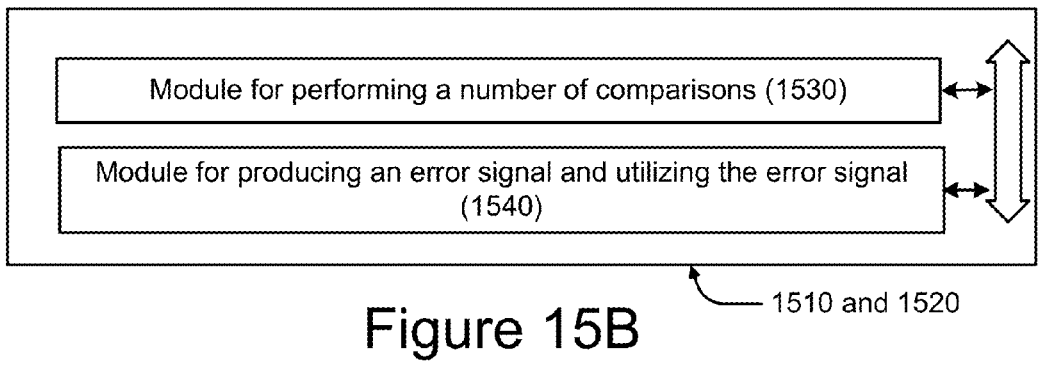

18. The apparatus of clause 17, wherein the means for operating and the means for merging comprise means for performing a number of comparisons (e.g., 1530 in FIG. 15B) to reduce decision errors, wherein the number of comparisons is greater than a minimum number of comparisons, wherein the minimum number of comparisons is $(2^P)-1$, wherein p is the number of bits to be utilized per successive approximation cycle, wherein p is an integer number greater than 1.

19. The apparatus of clause 18, wherein the means for operating and the means for merging comprise means for producing an error signal that comprises a difference between the analog input signal and a signal computed in connection with one of the successive approximation cycles, and utilizing the error signal in at least one of the comparisons (e.g., 1540 in FIG. 15B), wherein the minimum number of comparisons is associated with a first number of error-signal division intervals, wherein the number of comparisons is associated with a second number of error-signal division intervals, wherein the second number of error-signal division intervals is greater than the first number of error-signal division intervals.

Figure 16A:
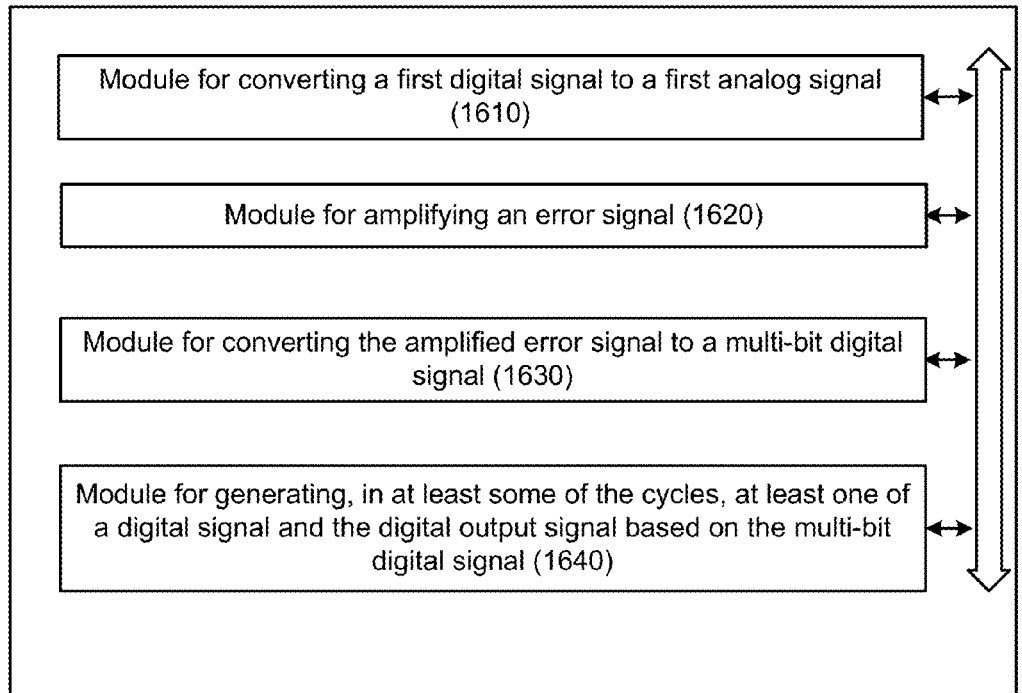
Figure 16B:
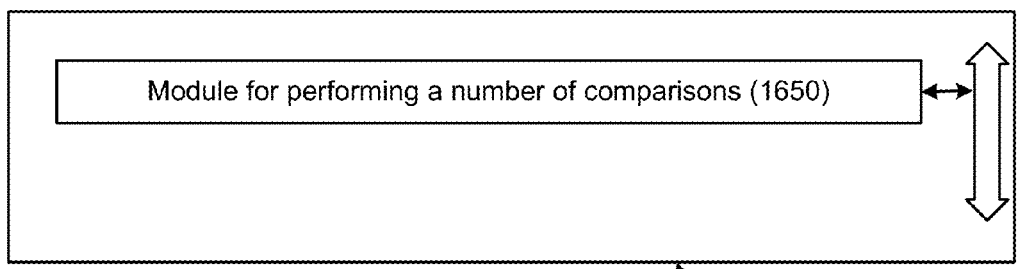

20. An apparatus for converting an analog input signal to a digital output signal in a number of successive approximation cycles, comprising:

means for converting a first digital signal to a first analog signal (e.g., 1610 in FIG. 16A);

means for amplifying an error signal, the error signal comprising a difference between the analog input signal and the first analog signal (e.g., 1620 in FIG. 16A);

means for converting the amplified error signal to a multi-bit digital signal (e.g., 1630 in FIG. 16A); and means for generating, in at least some of the cycles, at least one of a digital signal and the digital output signal based on the multi-bit digital signal (e.g., 1640 in FIG. 16A), wherein a gain associated with the means for amplifying is increased during at least some of the successive approximation cycles.

21. The apparatus of clause 20, wherein the means for converting the amplified error signal to the multi-bit digital signal comprises means for performing a number of comparisons (e.g., 1650 in FIG. 16A), and wherein the means for converting the amplified error signal to the multi-bit digital signal comprises means for performing an additional number of comparisons to reduce decision errors.

Figure 17:
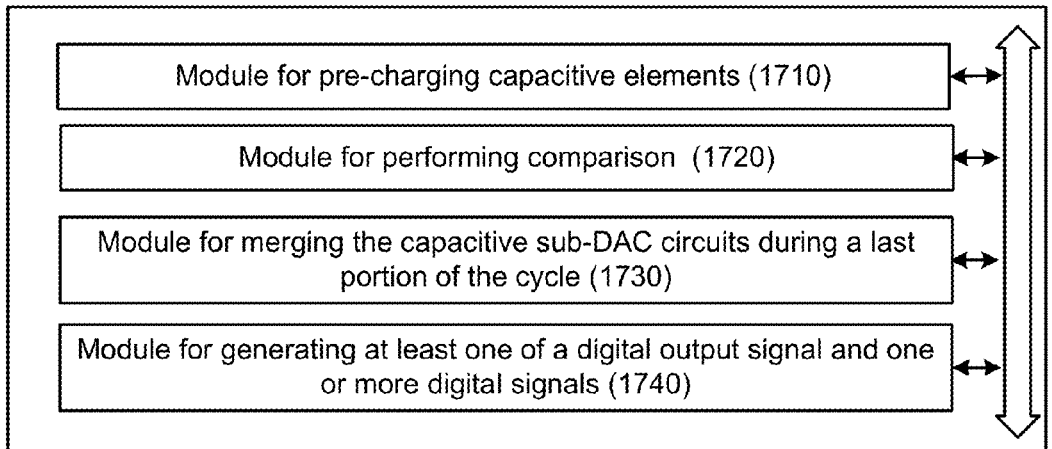

22. An analog-to-digital converter (ADC) circuit for converting an analog input signal to a digital output signal in a number of cycles, the ADC circuit comprising:

means for pre-charging capacitive elements, the capacitive elements grouped into a number of capacitive sub-DAC circuits (e.g., 1710 in FIG. 17);

means for performing comparison coupled to the capacitive sub-DAC circuits (e.g., 1720 in FIG. 17);

means for merging the capacitive sub-DAC circuits during a last portion of the cycles (e.g., 1730 in FIG. 17); and means for generating at least one of a digital output signal and one or more digital signals (e.g., 1740 in FIG. 17).

Figure 18:
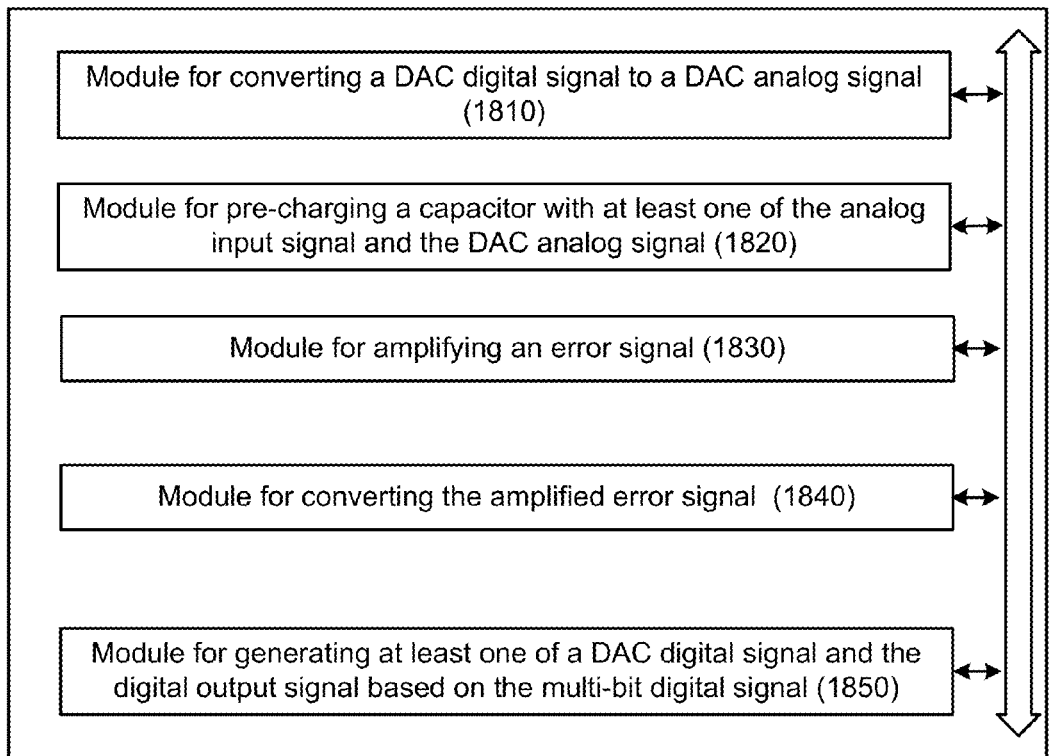

23. An analog-to-digital converter (ADC) circuit for converting an analog input signal to a digital output signal in a number of cycles, the ADC circuit comprising:

means for converting a DAC digital signal to a DAC analog signal (e.g., 1810 in FIG. 18);

means for pre-charging a capacitor with at least one of the analog input signal and the DAC analog signal (e.g., 1820 in FIG. 18);

means for amplifying an error signal (e.g., 1830 in FIG. 18);

means for converting the amplified error signal to a multi-bit digital signal (e.g., 1840 in FIG. 18); and means for generating at least one of a DAC digital signal and the digital output signal based on the multi-bit digital signal (e.g., 1850 in FIG. 18).

Other Remarks

In one aspect, any of the clauses herein may depend from any one of the independent clauses or any one of the dependent clauses. In one aspect, any of the clauses (e.g., dependent or independent clauses) may be combined with any other clauses (e.g., dependent or independent clauses). In one aspect, a claim may include some or all of the words (e.g., steps, operations, means or components) recited in a clause, a sentence, a phrase or a paragraph. In one aspect, a claim may include some or all of the words recited in one or more clauses, sentences, phrases or paragraphs. In one aspect, some of the words in each of the clauses, sentences, phrases or paragraphs may be removed. In one aspect, additional words or elements may be added to a clause, a sentence, a phrase or a paragraph. In one aspect, the subject technology may be implemented without utilizing some of the components, elements, functions or operations described herein. In one aspect, the subject technology may be implemented utilizing additional components, elements, functions or operations.

In one aspect, any methods, instructions, code, means, logic, components, blocks, modules and the like (e.g., software or hardware) described or claimed herein can be represented in drawings (e.g., flow charts, block diagrams), such drawings (regardless of whether explicitly shown or not) are expressly incorporated herein by reference, and such drawings (if not yet explicitly shown) can be added to the disclosure without constituting new matter. For brevity, some (but not necessarily all) of the clauses/descriptions/claims are explicitly represented in drawings, but any of the clauses/descriptions/claims can be represented in drawings in a manner similar to those drawings explicitly shown. For example, a flow chart can be drawn for any of the clauses, sentences or claims for a method such that each operation or step is connected to the next operation or step by an arrow. In another example, a block diagram can be drawn for any of the clauses, sentences or claims having means-for elements (e.g., means for performing an action) such that each means-for element can be represented as a module for element (e.g., a module for performing an action).

Those of skill in the art would appreciate that items such as the various illustrative blocks, modules, elements, components, methods, operations, steps, and algorithms described herein may be implemented as electronic hardware or a combination of hardware and software.

To illustrate the interchangeability of hardware and software, items such as the various illustrative blocks, modules, elements, components, methods, operations, steps, and algorithms have been described generally in terms of their functionality. Whether such functionality is implemented as hardware or software depends upon the particular application and design constraints imposed on the overall system. Skilled artisans may implement the described functionality in varying ways for each particular application.

In one aspect, "means," a block, a module, an element, a component or a processor may be an item (e.g., one or more of blocks, modules, elements, components or processors) for performing one or more functions or operations. In one aspect, such an item may be an apparatus, hardware, or a portion thereof In an example, an item may be implemented as one or more circuits configured to perform the function(s) or operation(s). A circuit may include one or more circuits and/or logic. A circuit may be analog and/or digital. A circuit may be electrical and/or optical. A circuit may include transistors. In an example, one or more items may be implemented as a processing system (e.g., a digital signal processor (DSP), an application specific integrated circuit (ASIC), a field programmable gate array (FPGA), etc.). In one example, an item may also include a structure in the form of, for example, an instruction(s) for performing the function(s) or operation(s), where the instruction(s) are encoded or stored on a machine-readable medium, on another device, or on a portion thereof, where an instruction(s) may be software, an application(s), a subroutine(s), or a portion thereof. Those skilled in the art will recognize how to implement the instructions, circuits, and processing systems.

A reference to an element in the singular is not intended to mean "one and only one" unless specifically so stated, but rather "one or more." For example, a clock signal may refer to one or more clock signals, a control signal may refer to one or more control signals, an input signal may refer to one or more input signals, an output signal may refer to one or more output signals, and a signal may refer to differential voltage signals.

Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The word "exemplary" is used herein to mean "serving as an example or illustration." Any aspect or design described herein as "exemplary" is not necessarily to be construed as preferred or advantageous over other aspects or designs. In one aspect, various alternative configurations and operations described herein may be considered to be at least equivalent.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

In one aspect of the disclosure, when actions or functions are described as being performed by an item (e.g., receiving, determining, providing, generating, converting, displaying, notifying, accepting, selecting, controlling, transmitting, reporting, sending, or any other action or function), it is understood that such actions or functions may be performed by the item directly or indirectly. In one aspect, when a module is described as performing an action, the module may be understood to perform the action directly. In one aspect, when a module is described as performing an action, the module may be understood to perform the action indirectly, for example, by facilitating, enabling or causing such an action.

In one aspect, unless otherwise stated, all measurements, values, ratings, positions, magnitudes, sizes, and other specifications that are set forth in this specification, including in the claims that follow, are approximate, not exact. In one aspect, they are intended to have a reasonable range that is consistent with the functions to which they relate and with what is customary in the art to which they pertain.

In one aspect, the term "coupled" or the like may refer to being directly coupled. In another aspect, the term "coupled" or the like may refer to being indirectly coupled.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

Various items may be arranged differently (e.g., arranged in a different order, or partitioned in a different way) all without departing from the scope of the subject technology. In one aspect of the disclosure, the elements recited in the accompanying claims may be performed by one or more modules or sub-modules.

It is understood that the specific order or hierarchy of steps, operations or processes disclosed is an illustration of exemplary approaches. Based upon design preferences, it is understood that the specific order or hierarchy of steps, operations or processes may be rearranged. Some of the steps, operations or processes may be performed simultaneously. The accompanying method claims, if any, present elements of the various steps, operations or processes in a sample order, and are not meant to be limited to the specific order or hierarchy presented.

The disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

In one aspect, a transistor may refer to a bipolar junction transistor, a field effect transistor, or the like. In one aspect, FIGS. 7 and 10 provide examples of configurations with certain numbers of bits, sub-DAC's, switches, amplifiers, comparators, SAR, DAC, PGA, and other components. The subject technology, however, is not limited to these exemplary numbers, and can be implemented with other numbers of bits or components.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used, such term is intended to be inclusive in a manner similar to the term "comprise" as "comprise" is interpreted when employed as a transitional word in a claim.

The Title, Background, Summary, Brief Description of the Drawings and Abstract of the disclosure are hereby incorporated into the disclosure and are provided as illustrative examples of the disclosure, rather than limiting the disclosure or the scope of the claims. In addition, in the Detailed Description, it can be seen that the description provides illustrative examples and the various features are grouped together in various embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed configuration or operation. The following claims are hereby incorporated into the Detailed Description, with each claim standing on its own as a separately claimed subject matter.

The claims are not intended to be limited to the aspects described herein, but is to be accorded the full scope consistent with the language claims and to encompass all legal equivalents. Notwithstanding, none of the claims are intended to embrace subject matter that fails to satisfy the requirement of 35 U.S.C. §101, 102, or 103, nor should they be interpreted in such a way. Any unintended embracement of such subject matter is hereby disclaimed.

What is claimed is:

1. An n-bit analog-to-digital converter (ADC) circuit for converting an analog input signal to a digital output signal by processing more than one bit per cycle in a number of successive approximation cycles, the n-bit ADC circuit comprising:
   a digital-to-analog (DAC) circuit including a corresponding number of capacitive elements, each of the capacitive elements configured to be pre-charged to the analog input signal to obtain an error signal, the corresponding number of capacitive elements grouped into a number of capacitive sub-DAC circuits;
   a plurality of comparators, each of the plurality of comparators coupled to one of the capacitive sub-DAC circuits;
   a plurality of first switches configured to isolate the capacitive sub-DAC circuits during one or more first cycles of the successive approximation cycles and to merge the capacitive sub-DAC circuits during one or more last cycles of the successive approximation cycles; and
   a successive approximation register (SAR) circuit configured to receive an output signal from the plurality of comparators and to generate at least one of the digital output signal and a number of DAC digital signals,
   wherein n represents a positive integer greater than one.

2. The n-bit ADC circuit of claim 1, wherein the error signal comprises a difference between the analog input signal and a reference signal.

3. The n-bit ADC circuit of claim 1, wherein the corresponding number of capacitive elements substantially equals to $2^n$.

4. The n-bit ADC circuit of claim 1, further comprising a plurality of second switches, each of the plurality of second switches configurable to interconnect two adjacent ones of the plurality of comparators.

5. The n-bit ADC circuit of claim 1, further comprising an amplifier circuit coupled between an output of each of the capacitive sub-DAC circuits and an input of a corresponding one of the plurality of comparators, wherein each of the capacitive sub-DAC circuits is configured to receive one of the DAC digital signals, and wherein a number of bits of each of the capacitive sub-DAC circuits is less than a number of bits of the digital output signal.

6. The n-bit ADC circuit of claim 5, further comprising a plurality of shunt switches, each of the plurality of shunt switches configured to be closed to short out an input and an output of a corresponding one of the amplifier circuits when a corresponding one or more of the capacitive elements is pre-charged, each of the plurality of shunt switches configured to be open to disconnect from each other the input and the output of the corresponding one of the amplifier circuits when the input of the corresponding one of the amplifier circuits is ready for comparison.

7. The n-bit ADC circuit of claim 1, wherein the SAR circuit is configured to compute more than one bit per successive approximation cycle, during cycles prior to the one or more last cycles.

8. The n-bit ADC circuit of claim 1, wherein n is 8, and each of the capacitive sub-DAC circuits comprises a 6-bit DAC, and wherein the one or more last cycles comprise the last two cycles of the successive approximation cycles.

9. The n-bit ADC circuit of claim 1, wherein the n-bit ADC circuit is configured to compute the digital output signal in less than eight cycles, wherein the n-bit ADC circuit is configured to compute, during each of the first three cycles of the successive approximation cycles, two bits of the digital output signal, and wherein n is 8.

10. The n-bit ADC circuit of claim 1, wherein each of the plurality of comparators is configured to perform a number of comparisons, and wherein one or more of the plurality of comparators are configured to perform one or more comparisons in addition to the number of comparisons to allow the n-bit ADC circuit to be tolerant to decision errors including a decision error associated with at least one of a threshold level, an offset voltage, a settling time, and a gain value.

11. An n-bit analog-to-digital converter (ADC) circuit for converting an analog input signal to a digital output signal in a number of successive approximation cycles, the n-bit ADC circuit comprising:
    a digital-to-analog converter (DAC) circuit configured to generate a DAC analog signal by converting a DAC digital signal to the DAC analog signal;
    an input capacitor configured to be pre-charged to at least one of the analog input signal and the DAC analog signal;
    a programmable gain amplifier (PGA) circuit configured to amplify an error signal including a difference between the analog input signal and the DAC analog signal, wherein the PGA circuit is configured to change a gain of the PGA circuit during at least some of the successive approximation cycles;
    a multi-bit flash ADC circuit configured to convert the amplified error signal to a multi-bit digital signal; and
    a successive approximation register (SAR) circuit configured to use the multi-bit digital signal to generate, in at least some of the successive approximation cycles, at least one of a DAC digital signal and the digital output signal,
    wherein n represents a positive integer greater than one.

12. The n-bit ADC circuit of claim 11, wherein the DAC circuit comprises a single charge redistribution capacitive DAC.

13. The n-bit ADC circuit of claim 11, further comprising a plurality of switches configured to provide the error signal at an input port of the PGA circuit.

14. The n-bit ADC circuit of claim 11, further comprising a control circuit configured to provide a control signal to the PGA circuit, and wherein the PGA circuit is further configured to change the gain of the PGA circuit in response to the control signal.

15. The n-bit ADC circuit of claim 11, wherein the SAR circuit is configured to compute more than one bit per successive approximation cycle.

16. The n-bit ADC circuit of claim 11, wherein the multi-bit flash ADC circuit is configured to convert the amplified error signal by performing a number of comparisons, and wherein the multi-bit flash ADC circuit is further configured to allow the n-bit ADC circuit to be tolerant to decision errors including a decision error associated with at least one of a threshold level, an offset voltage, a settling time and a gain value, by performing one or more comparisons in addition to the number of comparisons.

17. A method of converting an analog input signal to a digital output signal, comprising:
   operating a successive approximation analog-to-digital converter (ADC) circuit to process more than one bit per cycle, the cycle being a successive approximation cycle, the operating comprising:
      operating a capacitive digital-to-analog (DAC) array of the ADC circuit as a plurality of decomposed capacitive sub-DAC circuits, during one or more first cycles; and
      merging the plurality of decomposed capacitive sub-DAC circuits of the capacitive DAC array, during one or more last cycles.

18. The method of claim 17, wherein the operating the successive approximation ADC circuit comprises performing a number of comparisons to reduce decision errors, wherein the number of comparisons is greater than a minimum number of comparisons, wherein the minimum number of comparisons is $(2^p)-1$, wherein p is the number of bits per cycle, wherein p is an integer number greater than 1.

19. The method of claim 18, wherein the operating the successive approximation ADC circuit comprises producing an error signal that comprises a difference between the analog input signal and a signal computed in connection with one cycle and utilizing the error signal in at least one of the comparisons,
   wherein the minimum number of comparisons is associated with a first number of error-signal division intervals, wherein the number of comparisons is associated with a second number of error-signal division intervals, wherein the second number of error-signal division intervals is greater than the first number of error-signal division intervals.

20. A method of converting an analog input signal to a digital output signal, comprising:
   operating a successive approximation analog-to-digital converter (ADC) circuit to process more than one bit per cycle, the cycle being a successive approximation cycle, the operating comprising:
      converting a first digital signal to a first analog signal;
      amplifying an error signal, the error signal comprising a difference between the analog input signal and the first analog signal;
      converting the amplified error signal to a multi-bit digital signal; and
      generating, in at least some of the cycles, at least one of a digital signal and the digital output signal based on the multi-bit digital signal,
   wherein a gain associated with the amplifying is increased during at least some of the cycles.

21. The method of claim 20, wherein the converting the amplified error signal to the multi-bit digital signal comprises performing a number of comparisons, and wherein the converting the amplified error signal to the multi-bit digital signal comprises performing an additional number of comparisons to reduce decision errors.

22. An analog-to-digital converter (ADC) circuit for converting an analog input signal to a digital output signal in a number of cycles, the ADC circuit comprising:
   a digital-to-analog (DAC) circuit including a corresponding number of capacitive elements, the capacitive elements configured to be pre-charged, the corresponding number of capacitive elements grouped into a number of capacitive sub-DAC circuits;
   a plurality of comparators coupled to the capacitive sub-DAC circuits;
   a plurality of first switches configured to merge the capacitive sub-DAC circuits during a last portion of the cycles; and
   a processing circuit configured to receive an output signal from at least some of the comparators and to generate at least one of a digital output signal and one or more digital signals.

23. An analog-to-digital converter (ADC) circuit for converting an analog input signal to a digital output signal in a number of cycles, the ADC circuit comprising:
   a digital-to-analog converter (DAC) circuit configured to convert a DAC digital signal to a DAC analog signal;
   a capacitor configured to be pre-charged to at least one of the analog input signal and the DAC analog signal;
   an amplifier circuit configured to amplify an error signal;
   a multi-bit ADC circuit configured to convert the amplified error signal to a multi-bit digital signal; and
   a processing circuit configured to use the multi-bit digital signal to generate at least one of a DAC digital signal and the digital output signal.

* * * * *